(12) United States Patent
Namioka

(10) Patent No.: US 9,305,925 B2
(45) Date of Patent: Apr. 5, 2016

(54) SEMICONDUCTOR INTEGRATED CIRCUIT DEVICE AND MANUFACTURING METHOD THEREOF

(71) Applicant: Renesas Electronics Corporation, Kawasaki-shi, Kanagawa (JP)

(72) Inventor: Seigo Namioka, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/531,336

(22) Filed: Nov. 3, 2014

(65) Prior Publication Data

US 2015/0145009 A1  May 28, 2015

(30) Foreign Application Priority Data

Nov. 26, 2013  (JP) ................. 2013-244224

(51) Int. Cl.
| | |
|---|---|
| *H01L 27/108* | (2006.01) |
| *H01L 29/417* | (2006.01) |
| *H01L 21/768* | (2006.01) |

(52) U.S. Cl.
CPC ...... *H01L 27/10814* (2013.01); *H01L 21/7684* (2013.01); *H01L 21/76801* (2013.01); *H01L 21/76843* (2013.01); *H01L 21/76877* (2013.01); *H01L 21/76883* (2013.01); *H01L 27/10855* (2013.01); *H01L 27/10894* (2013.01); *H01L 29/4175* (2013.01)

(58) Field of Classification Search
CPC ................. H01L 27/10814; H01L 21/76801; H01L 21/7684; H01L 21/76843; H01L 21/76877; H01L 21/76883; H01L 27/10855; H01L 27/10894; H01L 29/4175

USPC ......................................................... 257/296
See application file for complete search history.

(56) References Cited

U.S. PATENT DOCUMENTS

| | | | | |
|---|---|---|---|---|
| 6,150,689 A * | 11/2000 | Narui | ................ | H01L 27/10894 257/306 |
| 6,215,144 B1 * | 4/2001 | Saito | ........................ | H01L 28/40 257/303 |
| 6,255,151 B1 * | 7/2001 | Fukuda | ............. | H01L 27/10894 257/296 |
| 6,756,262 B1 * | 6/2004 | Nakamura | ............... | H01L 28/65 257/E21.009 |
| 6,762,449 B2 * | 7/2004 | Uchiyama | ............. | H01L 27/105 257/303 |
| 2002/0137281 A1 * | 9/2002 | Watanabe | ......... | H01L 27/10852 438/253 |
| 2008/0029801 A1 * | 2/2008 | Nakamura | ........ | H01L 27/10852 257/303 |
| 2011/0053369 A1 * | 3/2011 | Jang | .................. | H01L 21/76804 438/652 |

FOREIGN PATENT DOCUMENTS

| | | |
|---|---|---|
| JP | 2002-353334 A | 6/2002 |
| JP | 2011-49250 A | 10/2011 |

* cited by examiner

*Primary Examiner* — Karen Kusumakar
*Assistant Examiner* — Adam S Bowen
(74) *Attorney, Agent, or Firm* — Sughrue Mion, PLLC

(57) ABSTRACT

In order to achieve high-speed operation of an eDRAM, the eDRAM includes: a selection MISFET having a gate electrode that serves as a word line, a source region, and a drain region; a source plug electrode coupled to the source region; and a drain plug electrode coupled to the drain region DR1. The eDRAM further includes: a capacitive plug electrode coupled to the drain plug electrode; a bit line coupled to the source plug electrode; a stopper film covering the bit line; and a capacitive element that is formed over the stopper film and has a first electrode, a dielectric film, and a second electrode. The first electrode is coupled to the capacitive plug electrode, and the height of the capacitive plug electrode and that of the bit line are equal to each other.

19 Claims, 20 Drawing Sheets

SEMICONDUCTOR INTEGRATED CIRCUIT DEVICE AND MANUFACTURING METHOD THEREOF

CROSS-REFERENCE TO RELATED APPLICATIONS

The disclosure of Japanese Patent Application No. 2013-244224 filed on Nov. 26, 2013 including the specification, drawings and abstract is incorporated herein by reference in its entirety.

BACKGROUND

The present invention relates to a semiconductor integrated circuit device and a manufacturing method thereof, and relates, for example, to both an eDRAM in which a DRAM and a logic circuit are mounted mixedly, and a manufacturing method thereof.

A DRAM in an eDRAM (Embedded Dynamic Random Access Memory) has, for example: a plurality of word lines each extending in a first direction of a main surface of a semiconductor substrate; a plurality of bit lines each extending in a second direction that intersects with the first direction; and a plurality of DRAM cells each of which is arranged in a portion where the word line and the bit line intersect with each other and electrically coupled to the word line and the bit line.

The DRAM cell includes one selection MISFET (Metal Insulator Semiconductor Field Effect Transistor) and one capacitive element coupled in series to the selection MISFET. The selection MISFET includes both a gate electrode formed integrally with the word line and a semiconductor region serving as a source and a drain, and one of the source and the drain (e.g., source) is electrically coupled to the bit line, while the other (e.g., drain) is electrically coupled to the capacitive element.

The DRAM includes: a CUB (Capacitor Under Bit line) type in which the capacitive element is arranged in a layer under the bit line; and a COB (Capacitor Over Bit line) type in which the capacitive element is arranged in a layer over the bit line. Generally, the COB type is more advantageous in terms of high integration of a DRAM and miniaturization of a chip.

An example of the COB type DRAM is disclosed, for example, in Patent Document 1 (Japanese Unexamined Patent Application Publication No. 2002-353334). In this DRAM, the selection MISFET is covered with a first insulating film, and a first plug electrode is formed in a first contact hole formed in the first insulating film so as to expose the source and the drain of the selection MISFET, and the first plug electrode is coupled to each of the source and the drain of the selection MISFET. The bit line and a cap insulating film over the bit line are embedded in a second insulating film formed over the first insulating film, and the bit line is coupled to the source of the selection MISFET via the first plug electrode. A third insulating film is arranged over the second insulating film, and a capacitive element is formed in the third insulating film. The cap insulating film is arranged over the bit line, so that the capacitive element and the bit line are insulated from each other. A second contact hole is formed in the second insulating film so as to expose the first plug electrode coupled to the drain of the selection MISFET, and a second plug electrode is formed in the second contact hole. The capacitive element is coupled to the drain of the selection MISFET via the first plug electrode and the second plug electrode that are arranged in a laminated state.

Another example of the COB type DRAM is disclosed in Patent Document 2 (Japanese Unexamined Patent Application Publication No. 2011-49250). In this DRAM, a selection MISFET is covered with a first insulating film; a bit line contact hole and a wiring trench that communicates with the bit line contact hole are formed in the first insulating film; and a bit line contact is formed in the bit line contact hole and the wiring trench such that the bit line contact is coupled to the source of the selection MISFET. A first contact hole is formed in the first insulating film, and a first contact plug is formed in the first contact hole such that the first contact plug is coupled to the drain of the selection MISFET. A second insulating film and a third insulating film are formed over the first insulating film, and a capacitive element is formed in the third insulating film. The capacitive element and the bit line contact are isolated from each other by the second insulating film, and the capacitive element is coupled to the first contact plug via an opening formed in the second insulating film.

RELATED ART DOCUMENTS

Patent Documents

[Patent Document 1] Japanese Unexamined Patent Application Publication No. 2002-353334

[Patent Document 2] Japanese Unexamined Patent Application Publication No. 2011-49250

SUMMARY

In the DRAM disclosed in Patent Document 1, the height of the second plug electrode is equal to the total of the height of the bit line and the thickness of the cap insulating film over the bit line, and hence the aspect ratio of the second contact hole formed in the second insulating film becomes high, which cause an increase in the resistance between the capacitive element and the drain of the selection MISFET.

In Patent Document 2, a technique for dealing with the problem in Patent Document 1. In the DRAM disclosed in Patent Document 2, however, the height the first contact plug (in other words, the depth of the first contact hole) is equal to the height of the bit line contact hole (in other words, the total of the depth of the wiring trench and that of the bit line contact hole). Accordingly, the aspect ratio of the first contact hole formed in the first insulating film becomes high, which causes the fact that the resistance between the capacitive element and the drain of the selection MISFET cannot be sufficiently reduced.

Patent Document 2 will be further described. When the first contact hole is formed in the first insulating film, the sidewall of the first contact hole generally has a tapered shape. That is, the diameter of the opening at the lower end (bottom diameter) of the first contact hole becomes smaller than that of the opening at the upper end (top diameter) thereof. Because the taper angle of the sidewall is determined by etching conditions and is not dependent on the thickness of the first insulating film, the bottom diameter becomes smaller as the thickness of the first insulating film becomes larger (as the aspect ratio becomes larger, assuming that the top diameter is constant). As a result, the coupling resistance between the first contact plug formed in the first contact hole and the drain of the selection MISFET becomes large, and hence the resistance between the capacitive element and the drain of the selection MISFET cannot be sufficiently reduced, which hampers the DRAM from operating at high-speed.

Accordingly, there is a demand for improving the operating speed of a DRAM included in a semiconductor integrated circuit device.

Other problems and new characteristics will become clear from the description and accompanying drawings of the present specification.

According to one embodiment, a semiconductor integrated circuit device includes: a word line extending in a first direction; a bit line extending in a second direction that intersects with the first direction; and a MISFET having a gate electrode that serves as the word line, and a source region and a drain region that sandwich the gate electrode. The semiconductor integrated circuit device further includes: a source plug electrode electrically coupled to the source region; a drain plug electrode electrically coupled to the drain region; a capacitive plug electrode electrically coupled to the drain plug electrode; a bit line electrically coupled to the source plug electrode; an insulating film covering the bit line; and a capacitive element that is formed over the insulating film and has a first electrode, a dielectric film, and a second electrode. The first electrode is electrically coupled to the capacitive plug electrode, and the height of the capacitive plug electrode and that of the bit line are equal to each other.

Advantage of the Invention

According to the one embodiment, the operating speed of a DRAM included in a semiconductor integrated circuit device can be improved.

DETAILED DESCRIPTION

Figure 1:
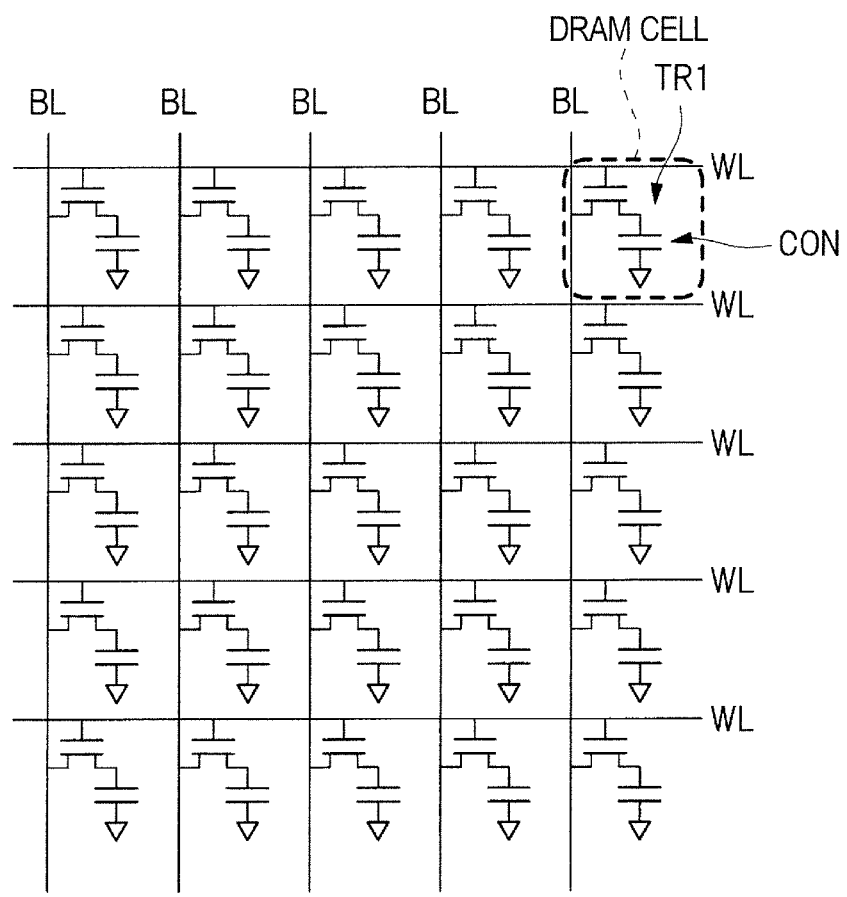
FIG. 1 is an equivalent circuit diagram of a DRAM cell array in a semiconductor integrated circuit device of First Embodiment.

Hereinafter, preferred embodiments will be described in detail based on the views. In each view for explaining the embodiments, components having the same function will be denoted with the same reference numerals, and duplicative description thereof will be omitted. In the following embodiments, description of the same or similar parts will not be repeated in principle, unless particularly necessary.

In the views used in the embodiments, hatching may be omitted even in sectional views in order to make them easier to see. Alternatively, hatching may be added even in plan views in order to make them easier to see.

First Embodiment

Semiconductor integrated circuit devices of the present and following embodiments are ones each including an eDRAM. The eDRAM includes a DRAM region DR and a logic circuit region LGC, and the DRAM region DR includes a DRAM cell array in which DRAM cells are arranged in a matrix pattern. The DRAM cell includes one n-channel type selection MISFET and one capacitive element coupled in series to the selection MISFET. Hereinafter, the selection MISFET will be described by using an n-channel type, but a p-channel type selection MISFET may be adopted. A plurality of the n-channel type MISFETs and p-channel type MISFETs are arranged in the logic circuit region LGC, but the present embodiment will be described by illustrating only the n-channel type MISFETs as an example. In addition to the DRAM cell array, a DRAM peripheral circuit (not illustrated) is present in the DRAM region DR, and a plurality of the n-channel type MISFETs and p-channel type MISFETs are arranged in the DRAM peripheral circuit, similarly to the logic circuit region LGC.

FIG. 1 is an equivalent circuit diagram of the DRAM cell array in the DRAM region DR. The DRAM cells are arranged in a matrix pattern in the DRAM cell array, and the DRAM cell is formed by an n-channel type selection MISFET (TR1) and a capacitive element CON coupled in series to the selection MISFET (TR1). The DRAM cell array has a plurality of word lines WL and a plurality of bit lines BL, and the DRAM cell is arranged at a portion where the word line WL and the bit line BL intersect with each other, and is electrically coupled to both the lines.

Figure 2:
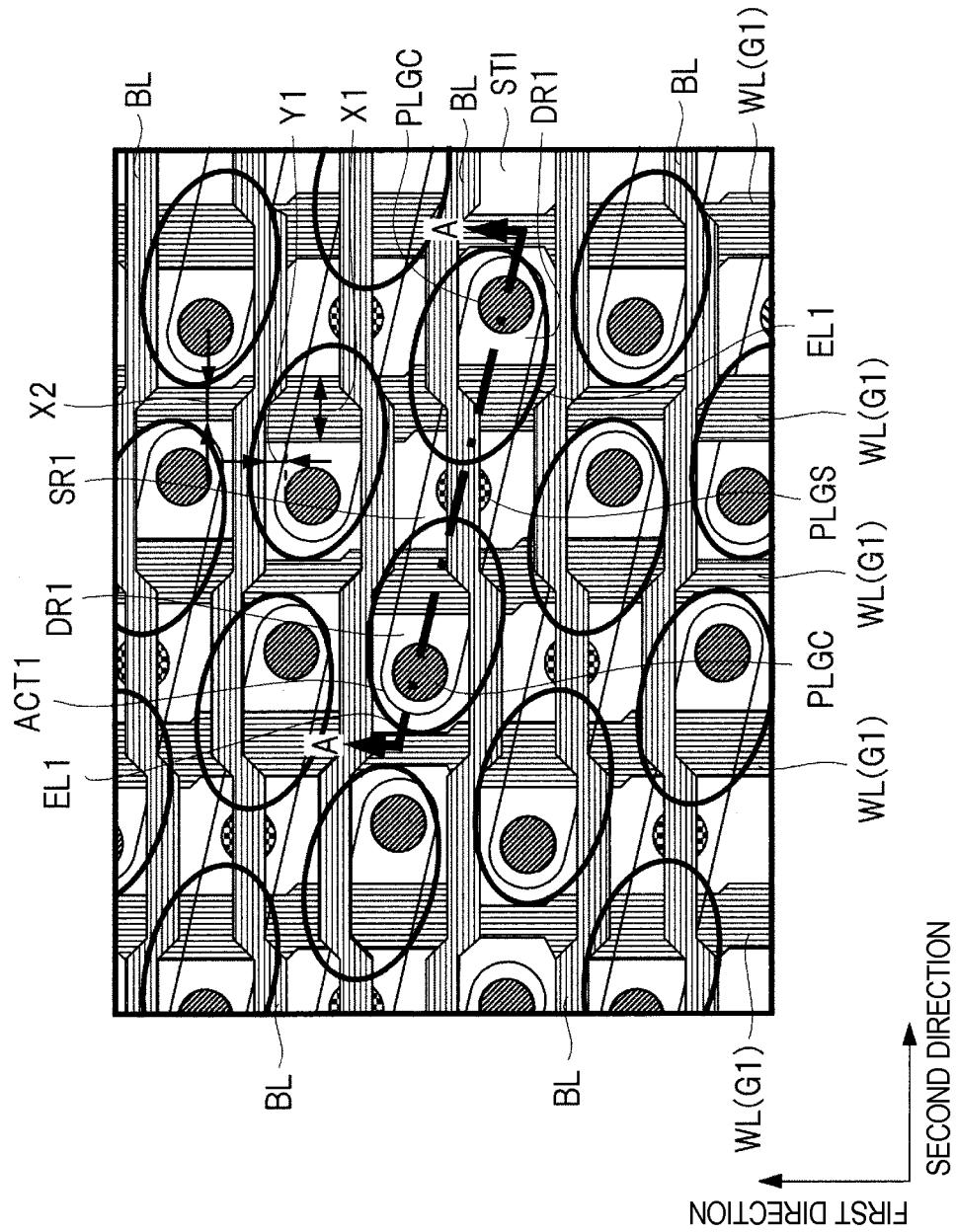
FIG. 2 is a layout view of the DRAM cell array.

FIG. 2 is a layout view of the DRAM cell array, and as illustrated there, the word lines WL extend in a first direction and the bit lines BL extend in a second direction that intersects with the first direction at right angles. A first active region ACT1 having an approximately rectangular shape is arranged so as to intersect with both the word lines WL and the bit lines BL and to extend in an oblique direction, and two selection MISFETs (TR1) are arranged in one first active region ACT1. The first active region ACT1 is surrounded by an element isolation film STI. Part of the word lines WL function as a gate electrode G1 of the selection MISFET (TR1). In the first active region ACT1, a source region SR1 and a drain region DR1 are arranged on both sides of the gate electrode G1. Two selection MISFETs (TR1) in one first active region ACT1 are arranged to share the source region SR1. Hereinafter, the side to be coupled to the bit line BL will be referred to as the source region SR1 and the side to be coupled to the capacitive element CON will be referred to as the drain region DR1, for convenience of description. The source region SR1 is electrically coupled to the bit line BL via a source plug electrode PLGS. A drain plug electrode PLGD and a capacitive plug electrode PLGC are arranged to be overlapped in this order over the drain region DR1, and the drain region DR1 is electrically coupled to a first electrode EL1 of the capacitive element CON via the drain plug electrode PLGD and the capacitive plug electrode PLGC. In plan view, the drain plug electrode PLGD is not seen by being hidden behind the capacitive plug electrode PLGC that is located over the drain plug electrode PLGD, and hence the capacitive plug electrode PLGC is only illustrated in FIG. 2. Each word line WL extends in the first direction while meandering, and has a first portion having a larger width (width: X1) and a second portion having a smaller width (width: X2). The relationship between X1 and X2 is X1>X2. The first portion corresponds to a portion having the largest width in each word line WL, while the second portion corresponds to a portion having the smallest width. The broad first portion in the word line WL is a portion that mainly overlaps the first active region ACT1, while the narrow second portion is a portion that overlaps the element isolation film STI and is sandwiched between the capacitive plug electrodes PLGC that are adjacent to each other in the second direction. Each bit line BL extends in the second direction while meandering, and is formed by a portion that stretches straight in the second direction and a portion that stretches in a direction that intersects with the second direction (in other words, a portion that joins the two portions stretching in the second direction). In the respective bit lines BL, the widths of the respective portions that stretch straight in the second direction are equal to each other.

The distance (indicated by Y1 in FIG. 2) between the capacitive plug electrode PLGC and the bit line BL in the first direction is smaller than the width (indicated by X2 in FIG. 2) of the second portion in the word line WL (Y1<X2), and the reason for that will be described in the later-described method of manufacturing a semiconductor integrated circuit device. Herein, the width (X2) of the second portion corresponds to the minimum processing dimension in a photolithography technique for manufacturing a semiconductor integrated circuit device.

Figure 3:
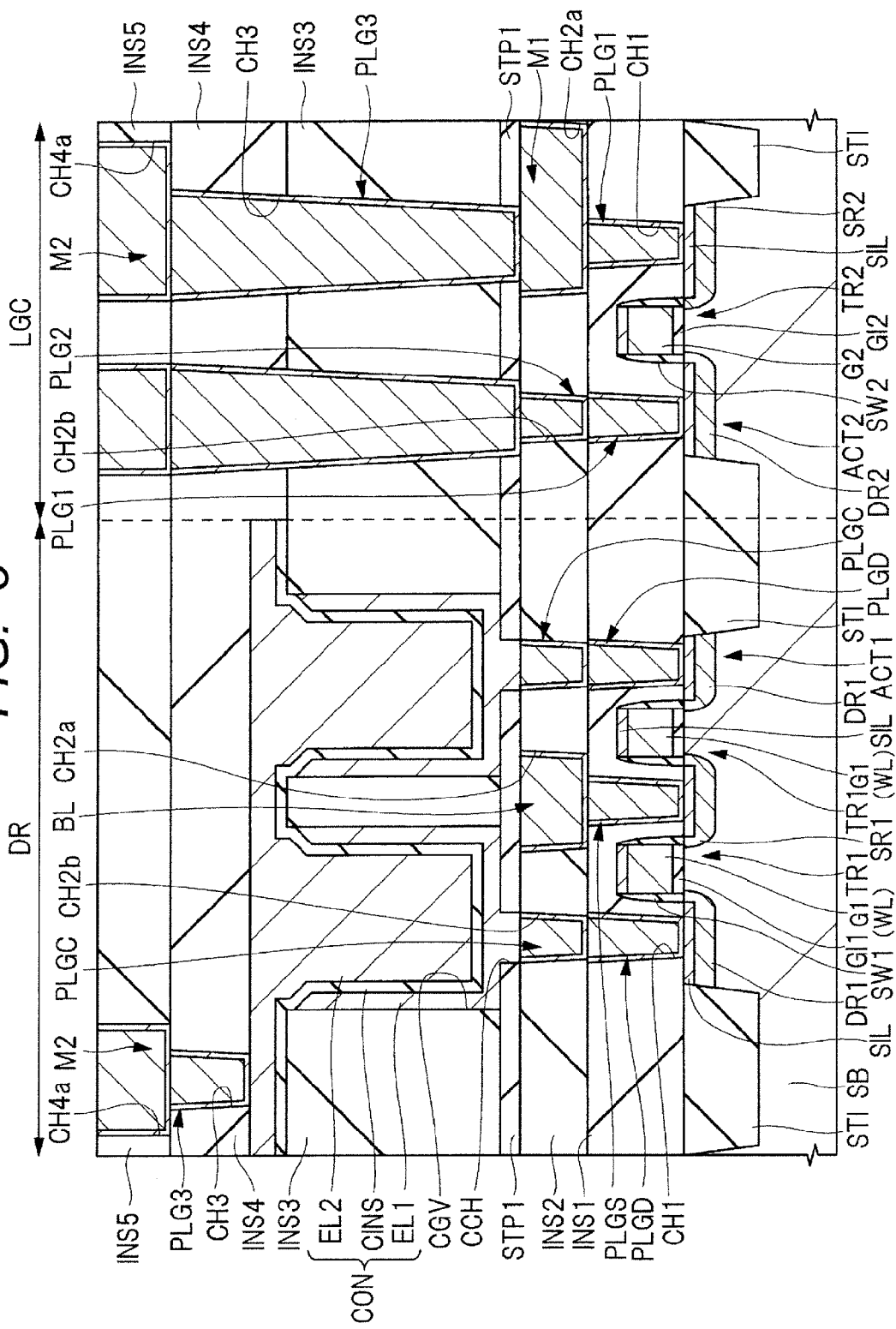
FIG. 3 is a sectional view of essential parts in a DRAM region and a logic circuit region in the semiconductor integrated circuit device of First Embodiment.

FIG. 3 is a sectional view of essential parts in the DRAM region DR and the logic circuit region LGC. The sectional view of the essential part in the DRAM region DR in FIG. 3 corresponds to a sectional view taken along A-A Line in FIG. 2, and two DRAM cells are illustrated in the DRAM region DR. One n-channel type logic MISFET (TR2) is illustrated in the logic circuit region LGC. The logic MISFET (TR2) and the selection MISFET (TR1) that forms the DRAM cell are formed in the main surface of a semiconductor substrate SB including, for example, p-type silicon. For the semiconductor substrate SB, an SOI (Silicon on Insulator) substrate may be adopted, in which a supporting substrate, an insulating film, and a p-type silicon substrate are laminated in this order. Alternatively, an n-type silicon semiconductor substrate SB or an SOI substrate in which a supporting substrate, an insulating film, and an n-type silicon substrate are laminated in this order may be adopted. The insulating element isolation film STI is formed over a main surface (top surface) of the semiconductor substrate SB so as to surround, in plan view, the first active region ACT1 and the second active region ACT2. The element isolation film STI is formed, for example, by a silicon oxide film.

In the DRAM region DR, two selection MISFETs (TR1) are formed in the first active region ACT1. The selection MISFET (TR1) has the gate electrode G1, the source region SR1, and the drain region DR1. The gate electrode G1 is formed over the main surface of the semiconductor substrate SB via a gate insulating film GI1, and the source region SR1 and the drain region DR1 are formed in the main surface of the semiconductor substrate SB on both sides of the gate electrode G1. A sidewall film SW1 including an insulating film is formed over a sidewall of the gate electrode G1, and a conductive silicide film SIL is formed over a main surface of the gate electrode G1 and over main surfaces of the source region SR1 and the drain region DR1.

In the logic circuit region LGC, the logic MISFET (TR2) is formed in the second active region ACT2, and has a gate electrode G2, a source region SR2, and a drain region DR2. The gate electrode G2 is formed over the main surface of the semiconductor substrate SB via a gate insulating film GI2, and the source region SR2 and the drain region DR2 are formed in the main surface of the semiconductor substrate SB on both sides of the gate electrode G2. A sidewall film SW2 including an insulating film is formed over a sidewall of the gate electrode G2, and the conductive silicide film SIL is formed over a main surface of the gate electrode G2 and over main surfaces of the source region SR2 and the drain region DR2.

Each of the gate electrode G1 and the gate electrode G2 is formed by a polycrystalline silicon film (polysilicon film). Each of the source region SR1, the drain region DR1, the source region SR2, and the drain region DR2 is formed by an n-type semiconductor region. Each of the sidewall films SW1 and SW2 includes, for example, a silicon oxide film, a silicon nitride film, or a laminated film of a silicon oxide film and a silicon nitride film. The silicide film SIL includes a nickel silicide film or a platinum-added nickel silicide film (nickel silicide film including platinum).

In the DRAM region DR and the logic circuit region LGC, an interlayer insulating film INS1 including an insulating film is formed over the semiconductor substrate SB so as to cover the selection MISFET (TR1) and the logic MISFET (TR2). The interlayer insulating film INS1 covers the main surfaces (upper surfaces) of the gate electrode G1 and the gate electrode G2, and thereby the bit line BL does not short-circuit with the gate electrode G1, even when they overlap each other in plan view. The interlayer insulating film INS1 includes a silicon oxide film, or a laminated structure in which a silicon nitride film and a silicon oxide film over the silicon nitride film are laminated each other. In the DRAM region DR and the logic circuit region LGC, a plurality of contact holes CH1, each of which penetrates the interlayer insulating film INS1, are formed in the interlayer insulating film INS1, and a plurality of plug electrodes each including a conducting film are formed in the contact holes CH1. The plug electrode is formed by a laminated structure in which a thin barrier conductor film (e.g., a titanium nitride (TiN) film, titanium (Ti) film, or laminated film thereof), which serves as a barrier metal, and a main conductor film (e.g., a tungsten film), having a thickness larger than that of the barrier conductor film, are laminated each other. The plug electrode penetrates the interlayer insulating film INS1 in its thickness direction, and the upper surface of the plug electrode is exposed to the top surface of the interlayer insulating film INS1. The plug electrode has a circular shape in plan view and an inverted trapezoidal shape in section view. That is, each of the upper surface and the bottom surface of the plug electrode has a circular shape, and the diameter ($\Phi t1$) of the upper surface is larger than the diameter ($\Phi b1$) of the bottom surface ($\Phi t1 > \Phi b1$). The plug electrodes include the source plug electrode PLGS coupled to the source region SR1 of the selection MISFET (TR1), the drain plug electrode PLGD coupled to the drain region DR1 of the selection MISFET (TR1), and a plug electrode PLG1 coupled to the source region SR2 or the drain region DR2 of the logic MISFET (TR2). Because the interlayer insulating film INS1 has a flat main surface (upper surface), the height (thickness) of the source plug electrode PLGS, that of the drain plug electrode PLGD, and that of the plug electrode PLG1 are equal to each other. As described above, the gate electrode G1 is covered with the interlayer insulating film INS1 and the interlayer insulating film INS1 has a flat main surface, and hence the height (thickness) of the source plug electrode PLGS or that of the drain plug electrode PLGD is larger than that of the gate electrode G1. Similarly, the height (thickness) of the plug electrode PLG1 is larger than that of the gate electrode G2. The height of the gate electrode G1 means the distance between the main surface of the semiconductor substrate SB and the main surface (upper surface) of the silicide film SIL formed over the top surface of the gate electrode G1. Similarly, the height of the gate electrode G2 means the distance between the main surface of the semiconductor substrate SB and the main surface (top surface) of the silicide film SIL formed over the top surface of the gate electrode G2. Herein, in the DRAM region DR, the thickness of the interlayer insulating film INS1 over the element isolation film STI is 150 to 250 nm, and in the present embodiment it is designed to be 200 nm. The height of the gate electrode G1 (i.e., the total thickness of the gate insulating film GI1, the gate electrode G1, and the silicide film SIL) is 50 to 110 nm, and in the present embodiment it is designed to be 80 nm. Accordingly, the height of each of the source plug electrode PLGS and the drain plug electrode PLGD is 150 to 250 nm, and in the present embodiment it is designed to be 200 nm.

An interlayer insulating film INS2 including an insulating film is formed over the interlayer insulating film INS1. The interlayer insulating film INS2 includes a silicon oxide film. The thickness of the interlayer insulating film INS2 should be equivalent to the thickness of the bit line BL, and the thickness of the interlayer insulating film INS2 is smaller than that of the interlayer insulating film INS1 and is 50 to 150 nm, and in the present embodiment it is designed to be 100 nm. A plurality of wiring trenches CH2a and a plurality of contact holes CH2b are formed in the interlayer insulating film INS2, and the bit line BL is formed in the wiring trench CH2a in the DRAM region DR and wiring M1 is formed in the wiring trench CH2a in the logic circuit region LGC. The capacitive plug electrode PLGC is formed in the contact hole CH2b in the DRAM region DR, and the plug electrode PLG2 is formed in the contact hole CH2b in the logic circuit region LGC. The capacitive plug electrode PLGC is laminated over the drain plug electrode PLGD via which the capacitive plug electrode PLGC is electrically coupled to the drain region DR1 of the selection MISFET (TR1). The bit line BL is formed to cover the upper surface of the source plug electrode PLGS, and is electrically coupled to the source region SR1 of the selection MISFET (TR1) via the source plug electrode PLGS. The plug electrode PLG2 is laminated over the plug electrode PLG1 via which the plug electrode PLG2 is electrically coupled to the drain region DR2 of the logic MISFET (TR2). The wiring M1 is formed to cover the upper surface of the plug electrode PLG1, and is electrically coupled to the source region SR2 of the logic MISFET (TR2) via the plug electrode PLG1.

Each of the capacitive plug electrode PLGC, the bit line BL, the plug electrode PLG2, and the wiring M1 is formed by a laminated structure in which a thin barrier conductor film (e.g., a titanium nitride (TiN) film, titanium (Ti) film, or laminated film thereof), which serves as a barrier metal, and a main conductor film (e.g., a tungsten film), having a thickness larger than that of the barrier conductor film, are laminated each other. The capacitive plug electrode PLGC, the bit line BL, the plug electrode PLG2, and the wiring M1 penetrate the interlayer insulating film INS2 in its thickness direction, and the top surfaces of them are exposed from the top surface of the interlayer insulating film INS2. The capacitive plug electrode PLGC has a circular shape in plan view and an inverted trapezoidal shape in section view. That is, each of the upper surface and the bottom surface of the capacitive plug electrode PLGC has a circular shape, and the diameter ($\Phi t2$) of the upper surface is larger than the diameter ($\Phi b2$) of the bottom surface ($\Phi t2 > \Phi b2$). In section view, the capacitive plug electrode PLGC is laminated over the drain plug electrode PLGD, and the diameter ($\Phi t2$) of the upper surface of the capacitive plug electrode PLGC is equal to the diameter ($\Phi t1$) of the upper surface of the drain plug electrode PLGD ($\Phi t2 = \Phi t1$). Because the thickness of the interlayer insulating film INS2 is smaller than that of the interlayer insulating film INS1, the diameter ($\Phi b2$) of the bottom surface of the capacitive plug electrode PLGC is larger than the diameter ($\Phi b1$) of the bottom surface of the drain plug electrode PLGD ($\Phi b2 > \Phi b1$). The height (thickness) of the capacitive plug electrode PLGC, that of the plug electrode PLG2, that of the bit line BL, and that of the wiring M1 are equal to each other and are approximately 50 to 150 nm, respectively, and in the present embodiment they are respectively designed to be 100 nm. The thickness of the interlayer insulating film INS2 is smaller (thinner) than that of the interlayer insulating film INS1. Accordingly, the height (thickness) of each of the capacitive plug electrode PLGC, the plug electrode PLG2, the bit line BL, and the wiring M1 is smaller than that of each of the source plug electrode PLGS, the drain plug electrode PLGD, and the plug electrode PLG1.

A stopper film STP1 including an insulating film is formed over the upper surfaces (top surfaces) of the capacitive plug electrode PLGC, the plug electrode PLG2, the bit line BL, and the wiring M1. The stopper film STP1 includes a silicon nitride film, and the thickness thereof is approximately 50 nm. In the DRAM region DR, a plurality of capacitive contact holes CCH, each of which is an opening penetrating the stopper film STP1, are formed in the stopper film STP1, so that the upper surface of the capacitive plug electrode PLGC is exposed. The capacitive contact hole CCH has a circular shape in plan view, and is prevented from overlapping the bit line BL by making the diameter ($\Phi c$) thereof smaller than or equal to the diameter ($\Phi t2$) of the upper surface of the capacitive plug electrode PLGC.

An interlayer insulating film INS3 including an insulating film is formed over the stopper film STP1. The interlayer insulating film INS3 includes, for example, a silicon oxide film, and the thickness thereof is 300 to 600 nm. In the DRAM region DR, a plurality of capacitance formation trenches CGV, each of which penetrates the interlayer insulating film INS3, are provided in the interlayer insulating film INS3. The capacitance formation trench CGV has, in plan view, an elliptical shape illustrated as the first electrode EL1 in FIG. 2. In plan view, the upper surface (main surface) of the stopper film STP1 and the upper surface of the capacitive plug electrode PLGC are exposed in the capacitance formation trench CGV, the latter upper surface being exposed via the capacitive contact hole CCH provided in the stopper film STP1. Additionally, the capacitance formation trench CGV overlaps, in plan view, the bit line BL and the gate electrode G1 (word line WL).

The first electrode EL1 of the capacitive element CON is formed along the bottom surface and the sidewall of the capacitance formation trench CGV, and the first electrode EL1 is electrically coupled to the capacitive plug electrode PLGC. The first electrode EL1 includes a titanium nitride (TiN) film formed by a CVD (Chemical Vapor Deposition) method or an ALD (Atomic Layer Deposition) method, and the thickness thereof is 5 to 10 nm. Because the length (e.g., 100 to 200 nm) of the minor axis of the capacitance formation trench CGV having an elliptical shape in plan view is sufficiently larger than two times of the thickness of the first electrode EL1, the capacitance formation trench CGV is not filled up with the first electrode EL1. The first electrode EL1 is terminated in the capacitance formation trench CGV, and hence it does not extend to the upper surface (main surface) of the interlayer insulating film INS3 located outside the capacitance formation trench CGV. A plurality of the first electrodes EL1 respectively formed in the capacitance formation trenches CGV are electrically isolated from each other. The first electrode EL1 overlaps the bit line BL and the gate electrode G1 (word line WL) in plan view. The first electrode EL1 is electrically isolated from the bit line BL by the stopper film STP1. The first electrode EL1 and the gate electrode G1 (word line WL) are electrically isolated from each other by the stopper film STP1, the interlayer insulating film INS2, and the interlayer insulating film INS1.

A dielectric film CINS is formed over the first electrode EL1 so as to cover it. A second electrode EL2 is formed over the dielectric film CINS so as to cover it. The dielectric film CINS and the second electrode EL2 are commonly formed in a plurality of the capacitive elements CON. In the DRAM region DR, both the dielectric film CINS formed over the top surface of the first electrode EL1 and the second electrode EL2, which are located in the capacitance formation trench CGV, extend outside the capacitance formation trench CGV to cover the upper surface (main surface) of the interlayer insulating film INS3. In plan view, the dielectric film CINS and the second electrode EL2 completely overlap each other and have the same planar shape as the other. Because the thickness of the first electrode EL1 is small with respect to the capacitance formation trench CGV and the dielectric film CINS and the second electrode EL2 extend also into the capacitance formation trench CGV, the capacitance of the capacitive element CON can be made large for a small plane area. The dielectric film CINS is formed by a single layer film including a zirconium oxide ($ZrO2$) film, hafnium oxide ($HfO2$) film, aluminum oxide ($Al2O3$) film, or tantalum oxide ($Ta2O5$) film, or a laminated film thereof. The second electrode EL2 is formed by a titanium nitride (TiN) film or a laminated film of a titanium nitride (TiN) film and a tungsten (W) film.

An interlayer insulating film INS4 including an insulating film is formed over the second electrode EL2 so as to cover it. In the logic circuit region LGC, the dielectric film CINS and the second electrode EL2 over the interlayer insulating film INS3 are removed, and hence the interlayer insulating film INS4 is formed over the interlayer insulating film INS3. In the DRAM region DR, a contact hole CH3 penetrating the interlayer insulating film INS4 is formed in the interlayer insulating film INS4. In the logic circuit region LGC, the contact hole CH3 is formed in a laminated structure of the stopper film STP1, the interlayer insulating film INS3, and the interlayer insulating film INS4. In the DRAM region DR and the logic circuit region LGC, a plug electrode PLG3 including a conductor film is formed in the contact hole CH3. The interlayer insulating film INS4 includes a silicon oxide film, and the plug electrode PLG3 is formed by a laminated structure in which a thin barrier conductor film (e.g., a titanium nitride (TiN) film, titanium (Ti) film, or laminated film thereof), which serves as a barrier metal, and a main conductor film (e.g., a tungsten film), having a thickness larger than that of the barrier conductor film, are laminated each other. In the DRAM region DR, the plug electrode PLG3 contacts the second electrode EL2 of the capacitive element CON to be electrically coupled thereto. In the logic circuit region LGC, the plug electrodes PLG3 contacts the plug electrode PLG2 and the wiring M1 to be electrically coupled to them.

An interlayer insulating film INS5 including an insulating film is formed over the interlayer insulating film INS4 so as to cover the plug electrode PLG3. The interlayer insulating film INS5 includes a low-k film such as a silicon oxide film or SiCOH film, and a plurality of wiring trenches CH4$a$ are formed in the interlayer insulating film INS5 so as to penetrate the interlayer insulating film INS5, and wiring M2 is formed in the wiring trench CH4$a$. The wiring M2 is copper wiring, and is formed by a laminated structure in which a thin barrier conductor film (e.g., a tantalum (Ta) film, titanium nitride (TiN) film, tantalum nitride (TaN) film, or laminated film thereof), which serves as a barrier metal, and a main conductor film (e.g., a copper (Cu) film), having a thickness larger than that of the barrier conductor film, are laminated each other. The wiring M2 contacts the upper surface (main surface) of the plug electrode PLG3 to be electrically coupled thereto. Herein, the wiring M2 and the plug electrode PLG3, which are illustrated in the DRAM region DR in FIG. 3, additionally illustrate an essential part in the DRAM region DR other than the position of A-A Line in FIG. 2.

Figure 4:
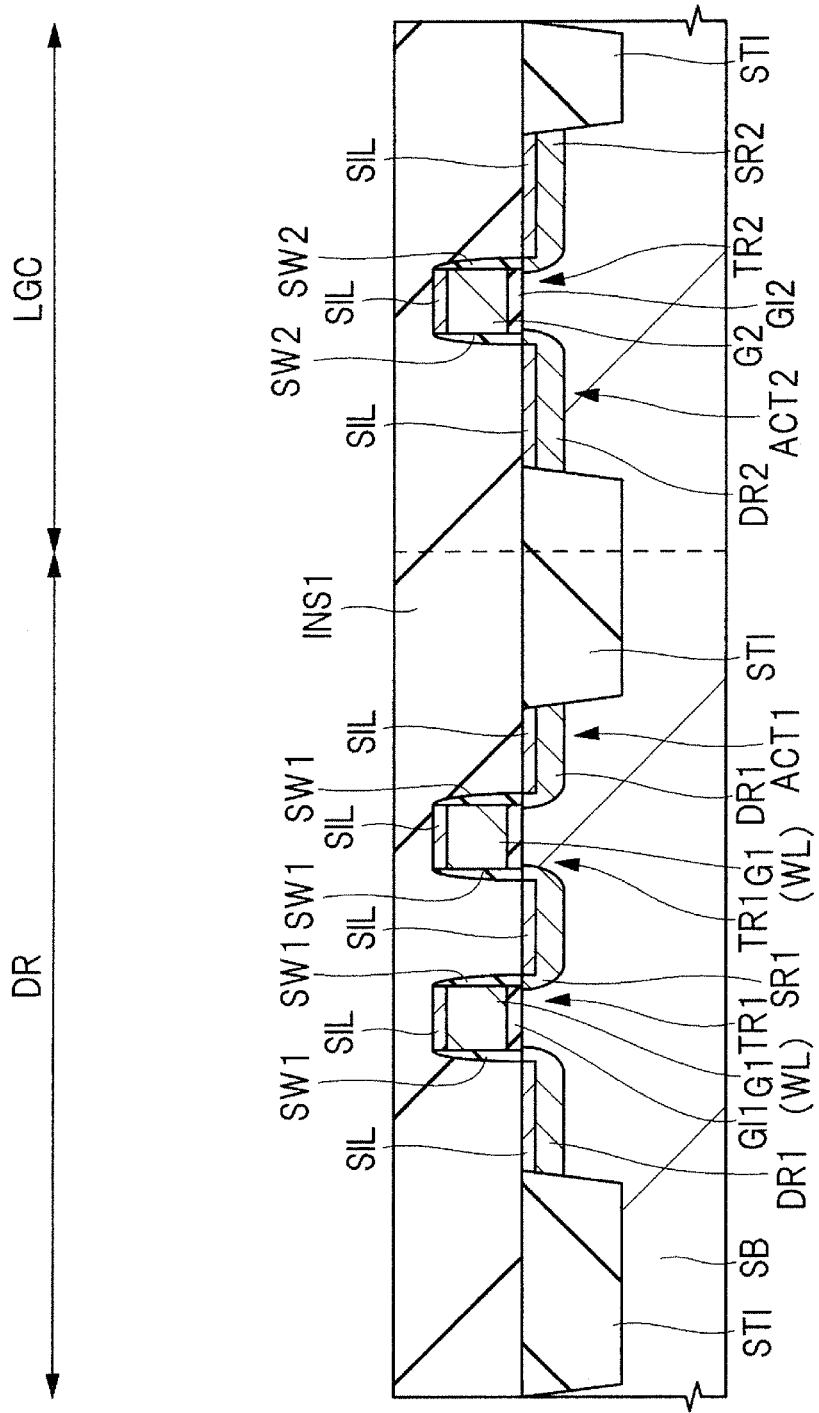
FIG. 4 is a sectional view of an essential part for illustrating a method of manufacturing the semiconductor integrated circuit device of First Embodiment.

FIGS. 4 to 14 are sectional views of an essential part during manufacturing steps for the semiconductor integrated circuit device of the present embodiment. The sectional views of an essential part of FIGS. 4 to 14 correspond to the sectional view of an essential part of FIG. 3. FIG. 4 is a view for explaining a step of providing the semiconductor substrate SB, over which the selection MISFET (TR1) and the logic MISFET (TR2) are to be formed, and a step of forming the interlayer insulating film INS1. The selection MISFET (TR1) is formed in the DRAM region DR in the semiconductor substrate SB, and the logic MISFET (TR2) is formed in the logic circuit region LGC. The interlayer insulating film INS1 is formed over the main surface of the semiconductor substrate SB so as to cover the selection MISFET (TR1) and the logic MISFET (TR2). Specifically, a silicon oxide film, which will serve as the interlayer insulating film INS1, is formed over the main surface of the semiconductor substrate SB by a PCVD (Plasma-Enhanced Chemical Vapor Deposition) method, etc. The thickness of the silicon oxide film is made larger than a thickness (e.g., approximately 350 nm) at which the space with the adjacent gate electrodes G1 is almost completely filled. Subsequently, the top surface of the interlayer insulating film INS1 is flattened by performing CMP (Chemical Mechanical Polishing) processing on the interlayer insulating film INS1, thereby allowing the interlayer insulating film INS1 having a flat main surface (upper surface) to be formed. That is, in the DRAM region DR, the thickness of the interlayer insulating film INS1 in the region with the adjacent gate electrode G1 (e.g., the source region SR1 or the drain region DR1) becomes larger than the thickness of the interlayer insulating film INS1 above the gate electrode G1 by approximately the thickness of the gate electrode G1. Incidentally, the thickness of the interlayer insulating film INS1 in the above region is larger by the total thickness of the gate insulating film GI1, the gate electrode G1, and the silicide film SIL. Herein, in the DRAM region DR, the thickness of the interlayer insulating film INS1 over the source region SR1, the drain region DR1, or the element isolation film STI is approximately 200 nm, while the thickness of the interlayer insulating film INS1 over the gate electrode G1 is approximately 120 nm. As the interlayer insulating film INS1, a laminated film may be adopted, in which a silicon nitride film is provided under the aforementioned silicon oxide film. In that case, the thickness of the silicon nitride film is made smaller than that of the silicon oxide film, and is designed to be, for example, approximately 50 to 100 nm.

Figure 5:
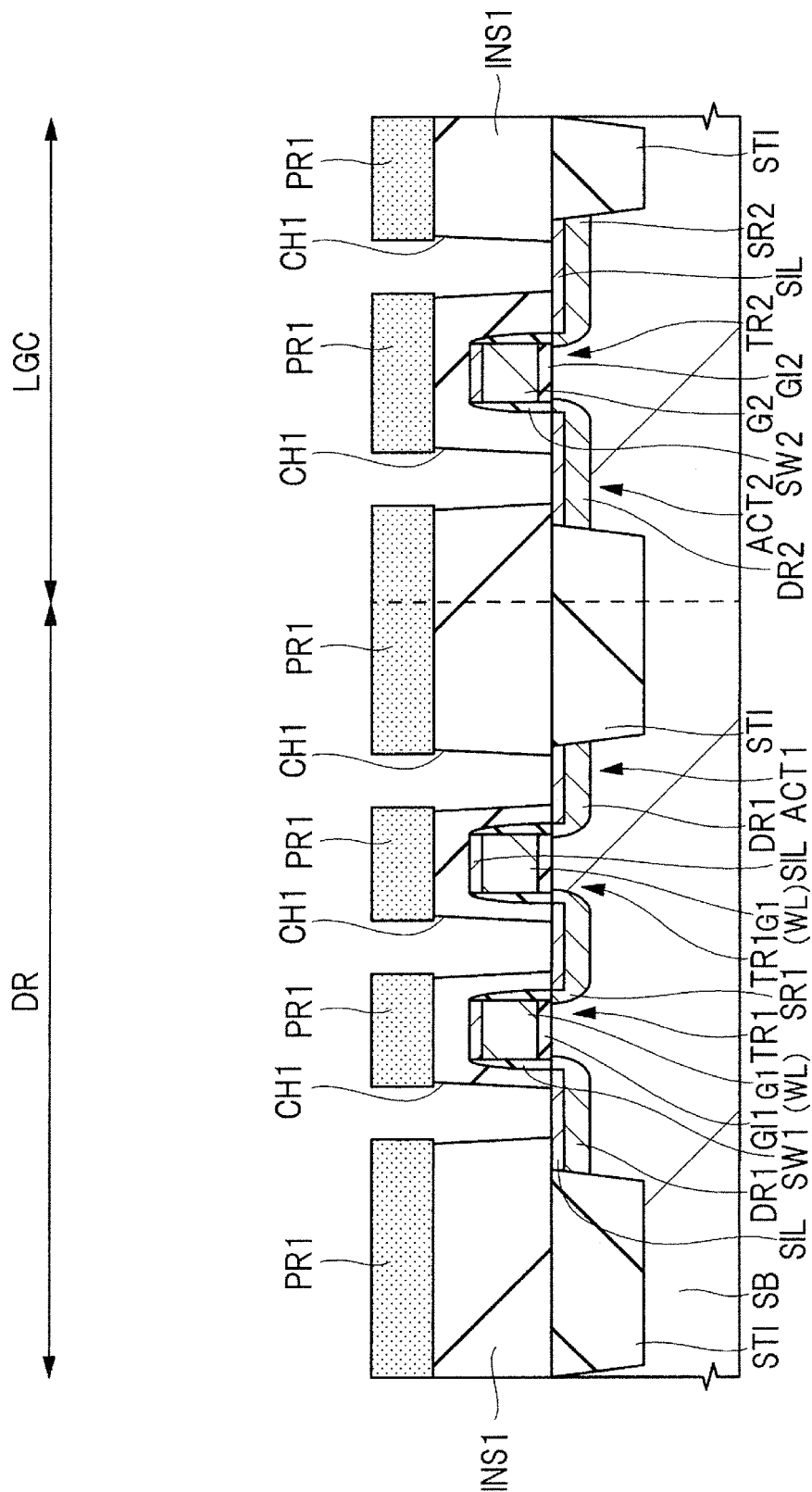
FIG. 5 is a sectional view of an essential part in the semiconductor integrated circuit device during a manufacturing step following that in FIG. 4.

FIG. 5 is a view for explaining a step of forming the contact hole CH1 in the interlayer insulating film INS1. A resist film PR1 including an insulating film is formed over the interlayer insulating film INS1. The resist film PR1 has openings corresponding to the contact holes CH1. Dry etching is performed on the interlayer insulating film INS1 by using the resist film PR1 as a mask, thereby allowing the contact holes CH1 to be formed in the interlayer insulating film INS1. The contact hole CH1 has a circular shape in plan view. The silicide film SIL, formed over the top surfaces of the source region SR1 and the drain region DR1 of the selection MISFET (TR1), is exposed by the contact holes CH1 provided in the interlayer insulating film INS1. Similarly, the silicide film SIL, formed over the top surfaces of the source region SR2 and the drain region DR2 of the logic MISFET (TR2), is also exposed. The sidewall of the interlayer insulating film INS1, which forms the contact hole CH1, has a shape tapered in the thickness direction of the interlayer insulating film INS1. That is, the diameter ($\Phi t1$) of the upper portion of the contact hole CH1 is larger than the diameter ($\Phi b1$) of the bottom portion ($\Phi t1 > \Phi b1$). Because the diameters of the upper portion and the bottom portion of the contact hole CH1 become equal to the diameters of the upper surface and the bottom surface of the plug electrode described with reference to FIG. 3, respectively, the former diameters are described by being denoted with the same reference numerals. All of the contact holes CH1 formed in the DRAM region DR and the logic circuit region LGC have the same diameter as the others in plan view.

Figure 6:
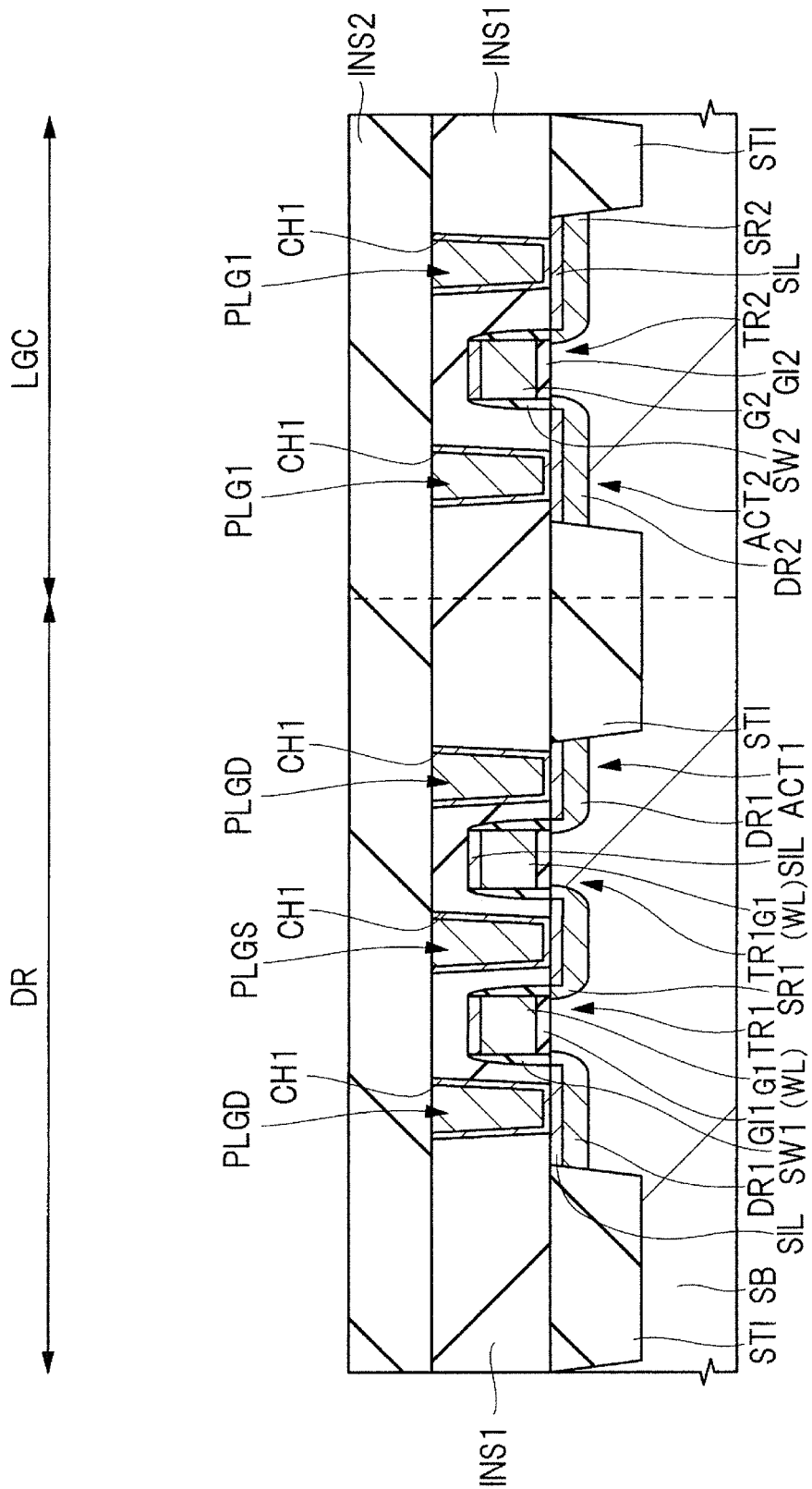
FIG. 6 is a sectional view of an essential part in the semiconductor integrated circuit device during a manufacturing step following that in FIG. 5.

FIG. 6 is a view for explaining a step of forming the plug electrode and the interlayer insulating film INS2. After the aforementioned resist film PR1 is removed, the barrier conductor film and the main conductor film are sequentially formed (deposited) over the interlayer insulating film INS1. Each of the barrier conductor film and the main conductor film is formed to have a thickness at which the contact hole CH1 is completely filled. CMP processing is then performed on the main conductor film and the barrier conductor film, thereby allowing the two films over the interlayer insulating film INS1 to be removed. The main conductor film and the barrier conductor film are left only in the contact hole CH1 by the CMP processing, thereby allowing the source plug electrode PLGS, the drain plug electrode PLGD, and the plug electrode PLG1, each of which includes a laminated film of the barrier conductor film and the main conductor film, to be formed. Each of the source plug electrode PLGS, the drain plug electrode PLGD, and the plug electrode PLG1 contacts the silicide film SIL exposed when the contact hole CH1 has been formed. Subsequently, the interlayer insulating film INS2 is formed over the interlayer insulating film INS1 by a PCVD method, so that the source plug electrode PLGS, the drain plug electrode PLGD, and the plug electrode PLG1 are covered.

Figure 7:
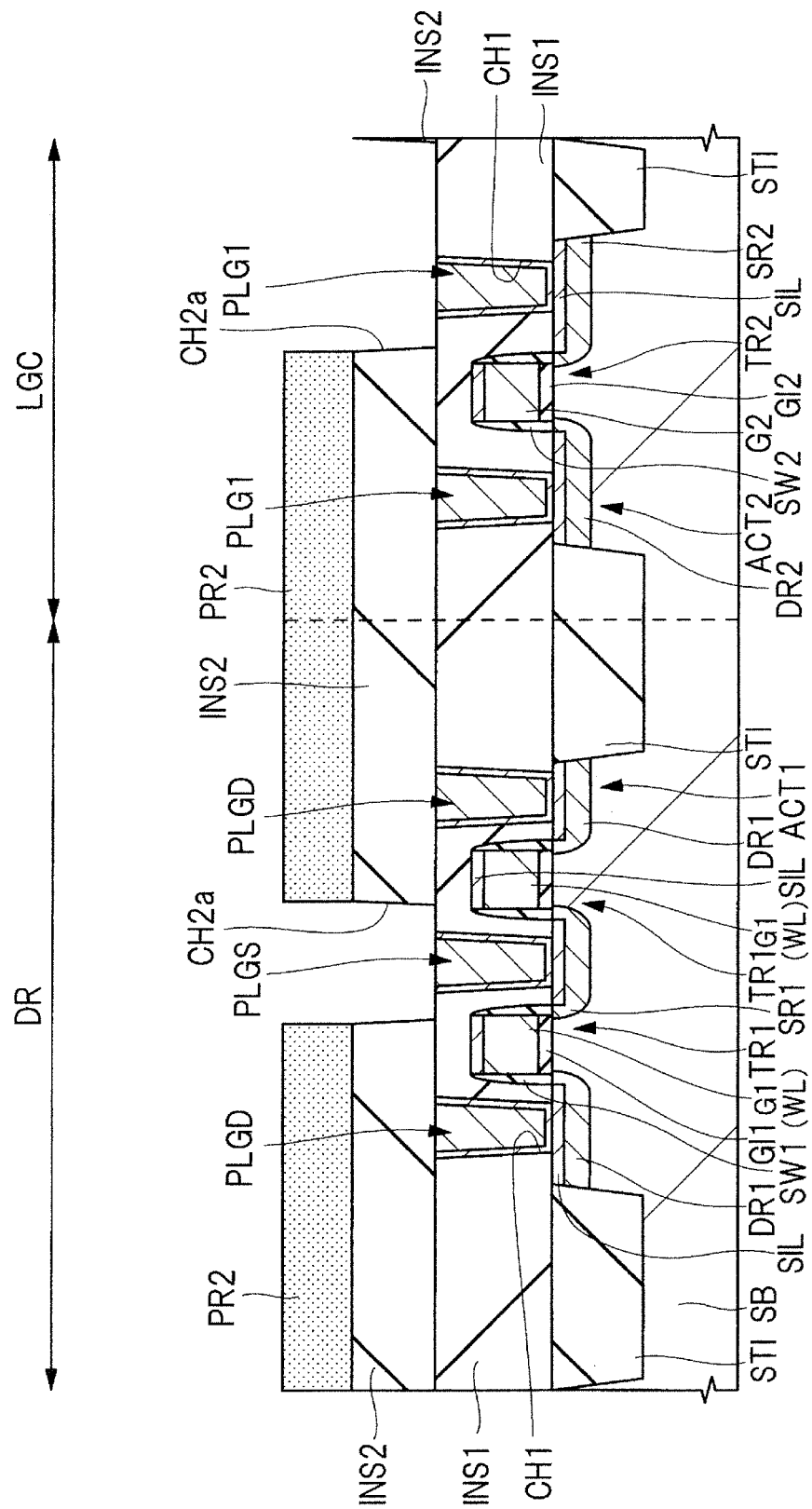
FIG. 7 is a sectional view of an essential part in the semiconductor integrated circuit device during a manufacturing step following that in FIG. 6.

FIG. 7 is a view for explaining a step of forming the wiring trench CH2a in which the bit line BL or the wiring M1 is formed. A resist film PR2, which has openings corresponding to the pattern of the bit lines BL and the wiring M1, is formed over the interlayer insulating film INS2. Subsequently, dry etching is performed on the interlayer insulating film INS2 by using, as a mask, the resist film PR2 including an insulating film, thereby allowing the wiring trenches CH2a to be formed in the DRAM region DR and the logic circuit region LGC. The head (upper surface) of the source plug electrode PLGS is exposed in the wiring trench CH2a in the DRAM region DR, while the head (upper surface) of the plug electrode PLG1 is exposed in the wiring trench CH2a in the logic circuit region LGC.

Figure 8:
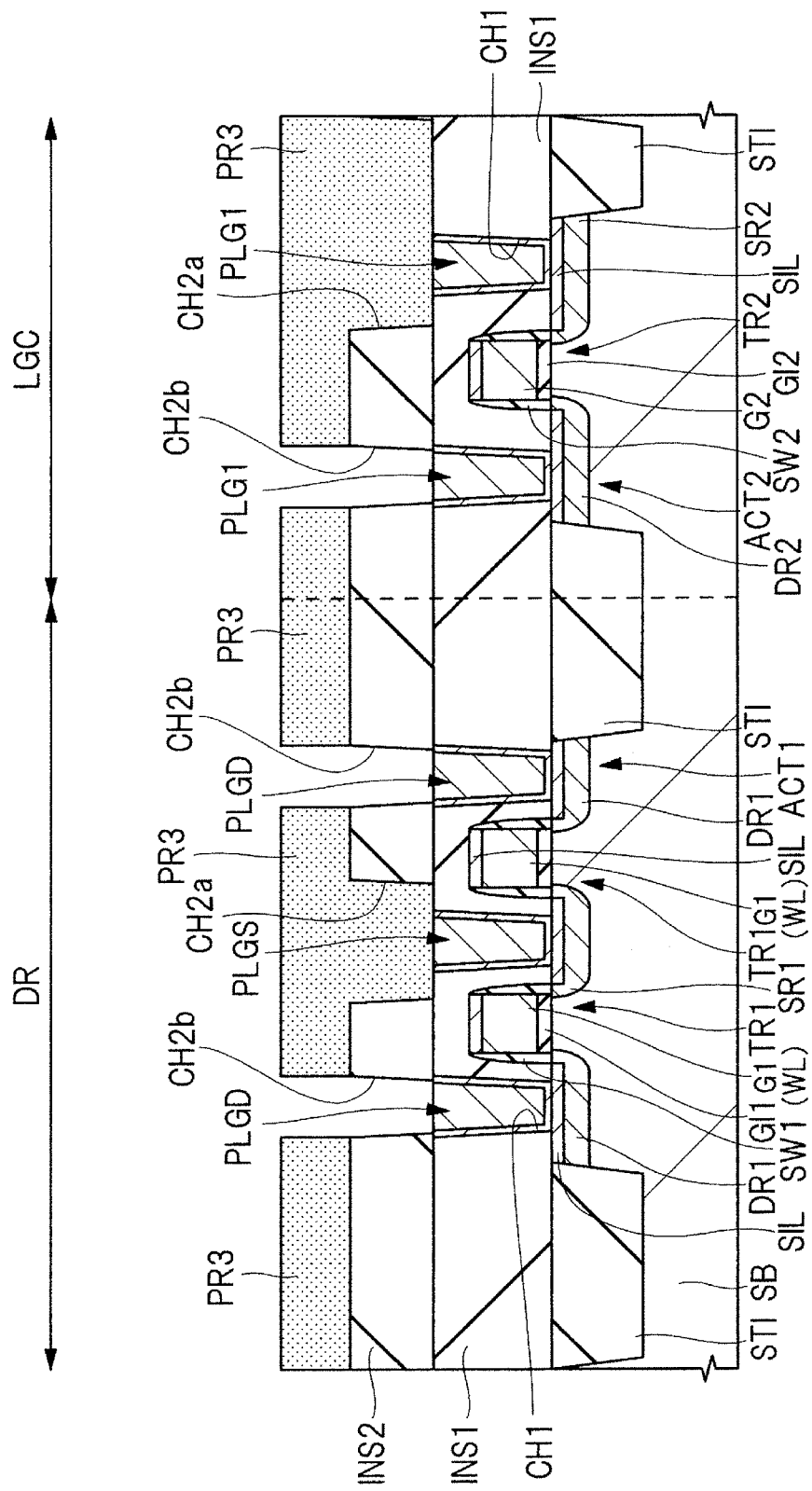
FIG. 8 is a sectional view of an essential part in the semiconductor integrated circuit device during a manufacturing step following that in FIG. 7.

FIG. 8 is a view for explaining a step of forming the contact hole CH2b in which the capacitive plug electrode PLGC or the plug electrode PLG2 is formed. After the aforementioned resist film PR2 is removed, a resist film PR3 including an insulating film is formed over the interlayer insulating film INS2. The resist film PR3 covers the wiring trenches CH2a formed in the interlayer insulating film INS2, and has openings corresponding to the pattern of the capacitive plug electrodes PLGC and the plug electrodes PLG2. Dry etching is performed on the interlayer insulating film INS2 by using, as a mask, the resist film PR3 having a pattern different from that of the resist film PR2, thereby allowing the contact holes CH2b to be formed in the DRAM region DR and the logic circuit region LGC. The contact hole CH2b has a circular shape in plan view. The heads (upper surfaces) of the drain plug electrode PLGD and the plug electrode PLG1 are exposed by the contact holes CH2b provided in the interlayer insulating film INS2, respectively. The sidewall of the interlayer insulating film INS2, which forms the contact hole CH2b, has a shape tapered in the thickness direction of the interlayer insulating film INS2. That is, the diameter ($\Phi t2$) of the upper portion of the contact hole CH2b is larger than the diameter ($\Phi b2$) of the bottom portion ($\Phi t2 > \Phi b2$). Because the diameters of the upper portion and the bottom portion of the contact hole CH2b become equal to the diameters of the upper surface and the bottom surface of the capacitive plug electrode PLGC described with reference to FIG. 3, respectively, the former diameters are described by being denoted with the same reference numerals. All of the contact holes CH2b formed in the DRAM region DR and the logic circuit region LGC have the same diameter as the others in plan view. Herein, the contact hole CH2b is formed after the wiring trench CH2a is first formed, but this order may be reversed. Additionally, the wiring trench CH2a and the contact hole CH2b, which are formed in the interlayer insulating film INS2, may be formed simultaneously (in the same step) by using one mask. In that case, there is the advantage that the number of manufacturing steps can be reduced.

Figure 9:
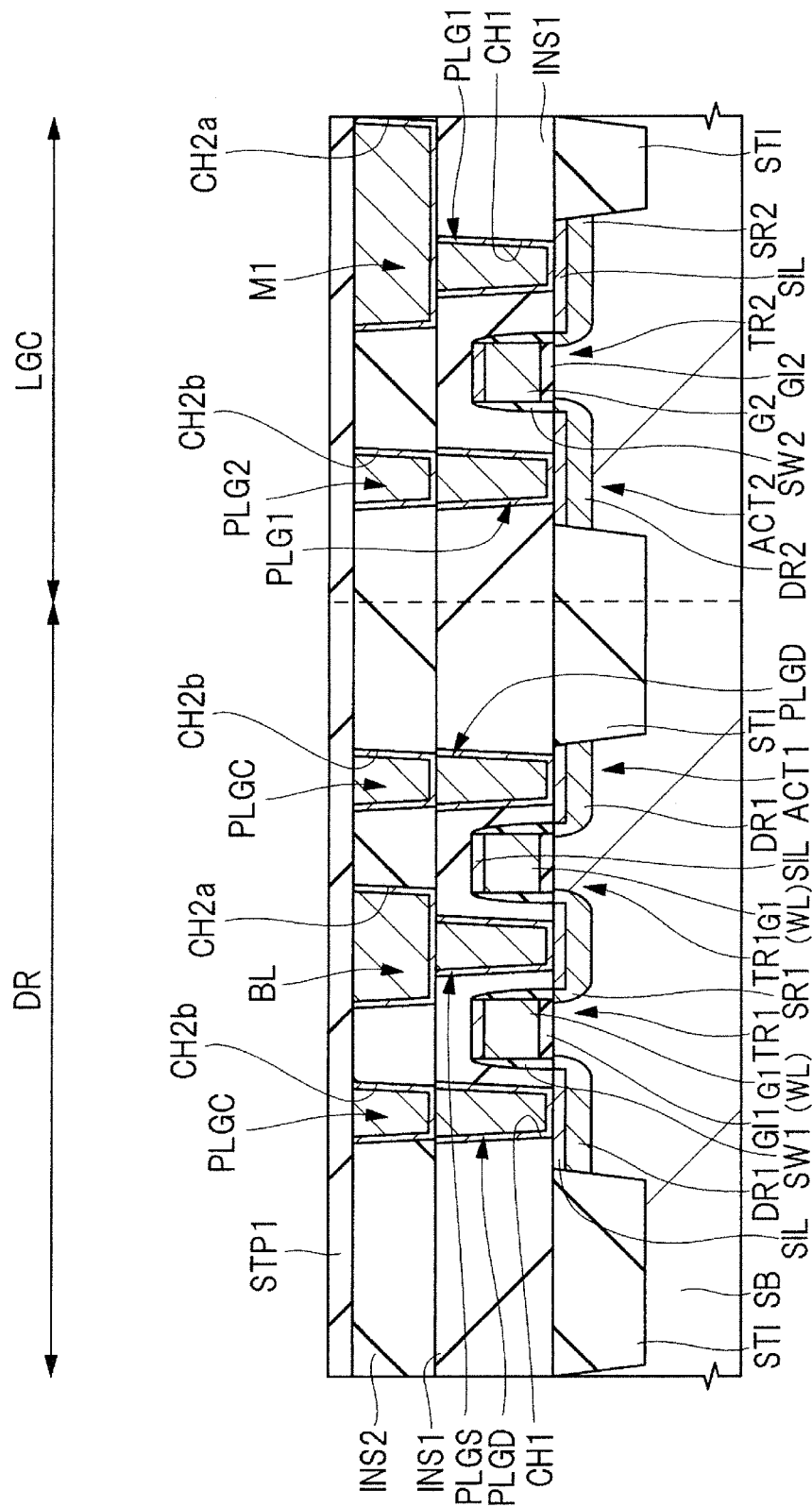
FIG. 9 is a sectional view of an essential part in the semiconductor integrated circuit device during a manufacturing step following that in FIG. 8.

FIG. 9 is a view for explaining a step of forming the capacitive plug electrode PLGC, the plug electrode PLG2, the bit line BL, the wiring M1, and the stopper film STP1. After the aforementioned resist film PR3 is removed, the barrier conductor film and the main conductor film are sequentially formed (deposited) over the interlayer insulating film INS2. Each of the barrier conductor film and the main conductor film is formed to have a thickness at which each of the wiring trench CH2 and the contact hole CH2b is completely filled. CMP processing is then performed on the main conductor film and the barrier conductor film, thereby allowing the two films over the interlayer insulating film INS2 to be removed. The main conductor film and the barrier conductor film are left in the wiring trench CH2a and the contact hole CH2b by the CMP processing, thereby allowing the capacitive plug electrode PLGC, the plug electrode PLG2, the bit line BL, and the wiring M1, each of which includes a laminated film of the barrier conductor film and the main conductor film, to be formed. The bit line BL contacts the head (upper surface) of the source plug electrode PLGS exposed when the wiring trench CH2a has been formed, while the wiring M1 contacts the head (upper surface) of the plug electrode PLG1 exposed when the wiring trench CH2a has been formed. The capacitive plug electrode PLGC and the plug electrode PLG2 respectively contact the drain plug electrode PLGD and the plug electrode PLG1 that have been exposed when the contact holes CH2b have been formed.

As described with reference to FIGS. 7 and 8, the wiring trench CH2a and the contact hole CH2b, which are formed in the interlayer insulating film INS2, have been formed in separate steps by using separate masks of the resist film PR2 and the resist film PR3 each having a pattern different from that of the other. With this method, the distance between the contact hole CH2b and the wiring trench CH2a, which are adjacent to each other, can be made small. That is, the distance between the contact hole CH2b and the wiring trench CH2a, which are adjacent to each other, can be made smaller than the case where the wiring trench CH2a and the contact hole CH2b are formed by using one mask. In the DRAM region DR, the capacitive plug electrode PLGC is formed in the contact hole CH2b and the bit line BL is formed in the wiring trench CH2a, as described with reference to FIG. 9, and hence the distance between the capacitive plug electrode PLGC and the bit line BL, which are adjacent to each other, can be made small. If the processing is performed by using one mask, a line or distance that is thinner (narrower) than the minimum processing dimension occurring when one mask is used cannot be processed. However, a distance smaller than or equal to the minimum processing dimension can be processed by using two separate masks. In the DRAM cell array described with reference to FIG. 2, the second portion having a smaller width in the word line generally has a width corresponding to the minimum processing dimension, which is also true in the present embodiment. Accordingly, the distance (Y1 in FIG. 2) between the capacitive plug electrode PLGC and the bit line BL, which are adjacent to each other, can be made smaller than the minimum processing dimension (X2 in FIG. 2), as described with reference to FIG. 2. Thereby, the area of the DRAM cell array can be reduced, in other words, high integration thereof can be achieved.

Subsequently, the stopper film STP1 is formed (deposited) over the interlayer insulating film INS2 by a PCVD method, so that the capacitive plug electrode PLGC, the plug electrode PLG2, the bit line BL, and the wiring M1 are covered.

Figure 10:
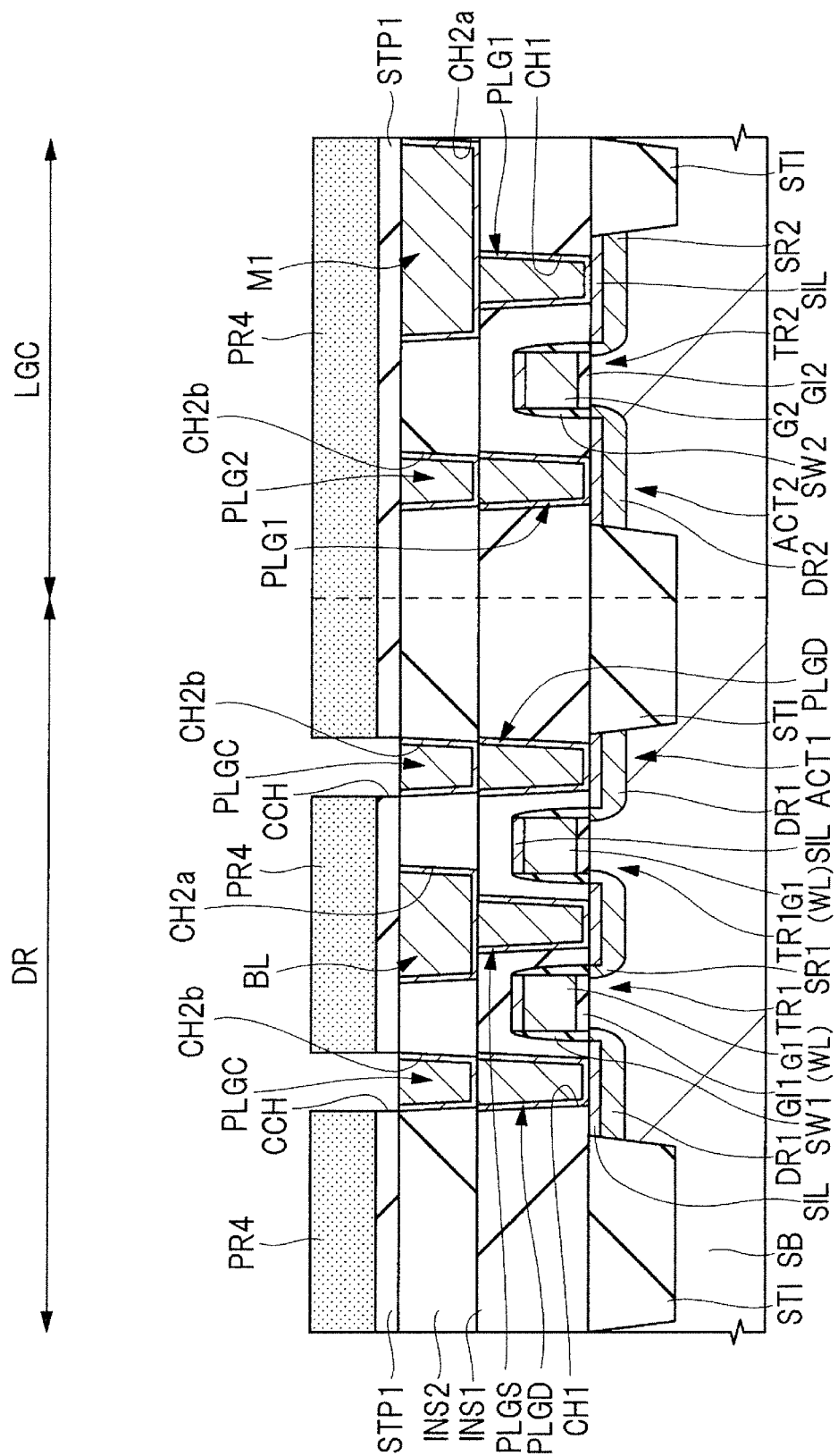
FIG. 10 is a sectional view of an essential part in the semiconductor integrated circuit device during a manufacturing step following that in FIG. 9.

FIG. 10 is a view for explaining a step of forming the capacitive contact hole CCH in the stopper film STP1. A resist film PR4, which includes an insulating film having openings corresponding to the capacitive contact holes CCH, is formed over the stopper film STP1, and dry etching is performed on the stopper film STP1 by using the resist film PR4 as a mask, thereby allowing the capacitive contact hole CCH to be formed. The capacitive contact hole CCH is formed over the capacitive plug electrode PLGC to expose the head (upper surface) of the capacitive plug electrode PLGC. Because the stopper film STP1 has a function of preventing the conduction between the first electrode EL1 of the capacitive element CON formed to overlap the bit line BL in plan view and the bit line BL, the stopper film STP1 completely covers the bit line BL in plan view. That is, the capacitive contact hole CCH never overlaps the bit line BL in plan view. Accordingly, the capacitive contact hole CCH is so formed that: the diameter ($\Phi c$) thereof is made smaller than or equal to the diameter ($\Phi t2$) of the upper surface of the capacitive plug electrode PLGC; and the center of the capacitive contact hole CCH overlaps that of the capacitive plug electrode PLGC. However, both the centers may be shifted from each other.

Figure 11:
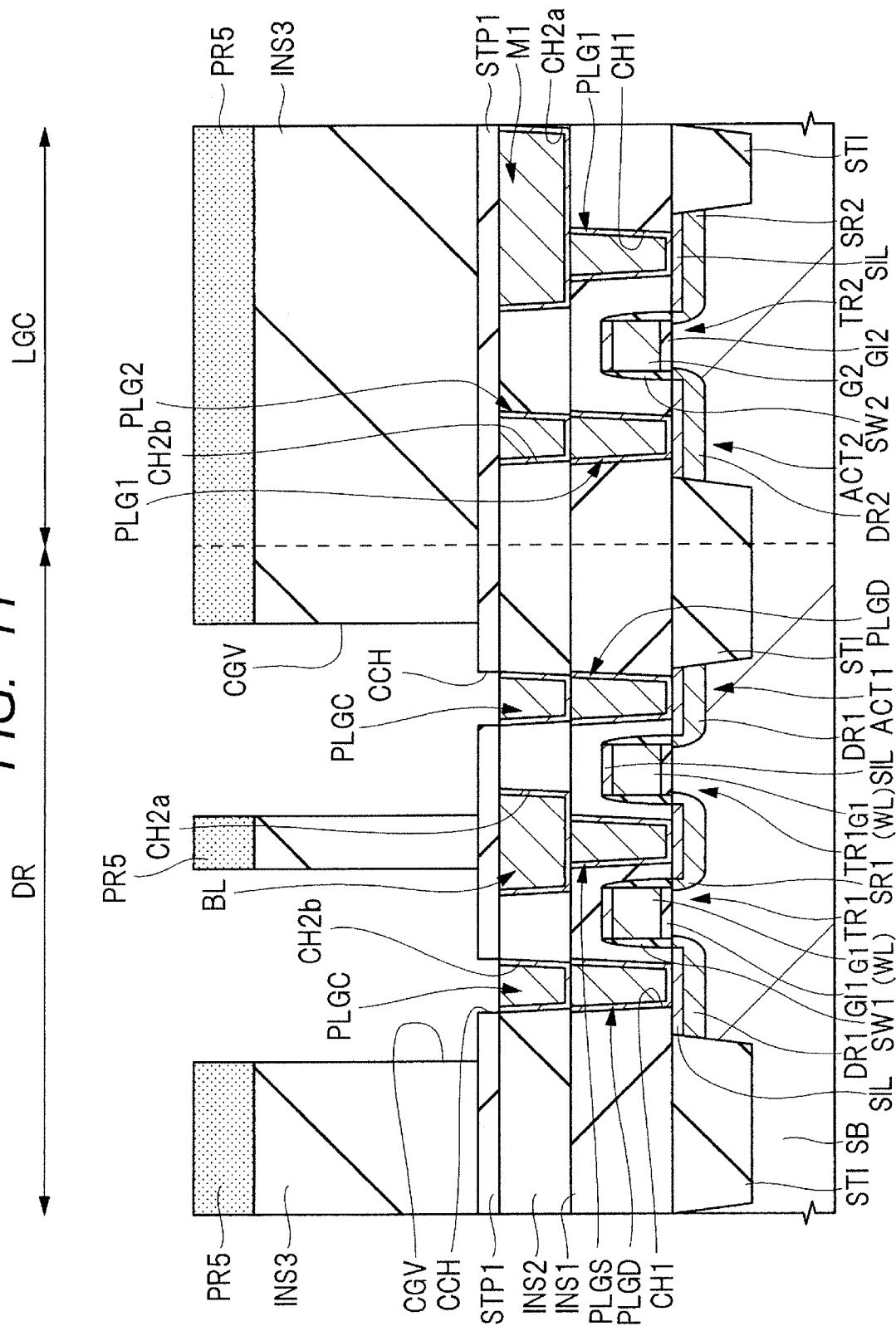
FIG. 11 is a sectional view of an essential part in the semiconductor integrated circuit device during a manufacturing step following that in FIG. 10.

FIG. 11 is a view for explaining a step of forming the interlayer insulating film INS3 and the capacitance formation trench CGV. After the aforementioned resist film PR4 is removed, the interlayer insulating film INS3 including an insulating film is formed (deposited) over the stopper film STP1 by a PCVD method. Subsequently, a resist film PR5, which includes an insulating film having openings corresponding to the pattern of the capacitance formation trenches CGV, is formed over the interlayer insulating film INS3, and dry etching is performed on the interlayer insulating film INS3 by using the resist film PR5 as a mask, thereby allowing the capacitance formation trench CGV to be formed. In the DRAM region DR, one capacitance formation trench CGV is formed over each capacitive plug electrode PLGC, and the stopper film STP1, the capacitive contact hole CCH, and the capacitive plug electrode PLGC are exposed to the bottom portion of the capacitance formation trench CGV.

Figure 12:
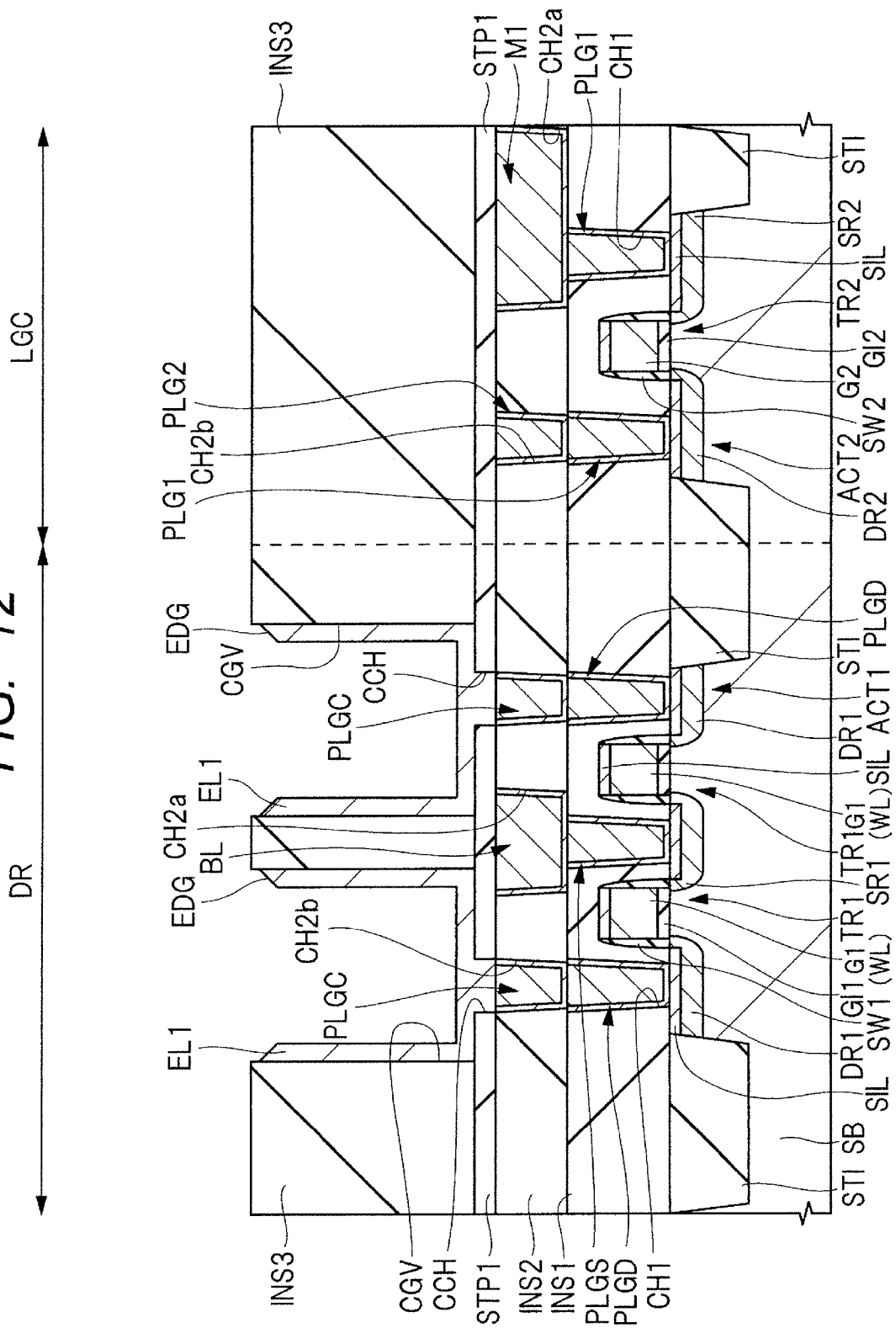
FIG. 12 is a sectional view of an essential part in the semiconductor integrated circuit device during a manufacturing step following that in FIG. 11.

FIG. 12 is a view for explaining a step of forming the first electrode EL1. After the aforementioned resist film PR5 is removed, the first electrode EL1 including a conductor film is formed along the sidewall and the bottom portion of the capacitance formation trench CGV. The first electrode EL1 is formed to have a small thickness such that the capacitance formation trench CGV is not filled up. The first electrode EL1 is formed also in the capacitive contact hole CCH so as to contact the upper surface of the capacitive plug electrode PLGC. Additionally, the first electrode EL1 is isolated from the first electrode EL1 formed in the adjacent capacitance formation trench CGV, and the end portion EDG of the first electrode EL1 is terminated at a position lower than the upper surface (main surface) of the interlayer insulating film INS3, without extending to the upper surface (main surface) thereof.

An example has been described above, in which the first electrode EL1 and the capacitive plug electrode PLGC directly contact each other; however, it is important that both are electrically coupled together, and a plug electrode (not illustrated), etc., which includes an electrical conductor such as a titanium nitride (TiN) film, titanium (Ti) film, tungsten (W) film, or the like, may be interposed between the first electrode EL1 and the capacitive plug electrode PLGC. That is, before the first electrode EL1 is formed, a conductor film is formed over the stopper film STP1 so as to have a thickness at which the capacitive contact hole CCH is almost completely filled (in which the thickness is larger than or equal to half the diameter of the circular capacitive contact hole CCH). Thereafter, by performing isotropic dry etching (etchback) on the whole conductor film, the conductor film can be selectively left only in the capacitive contact hole CCH.

Figure 13:
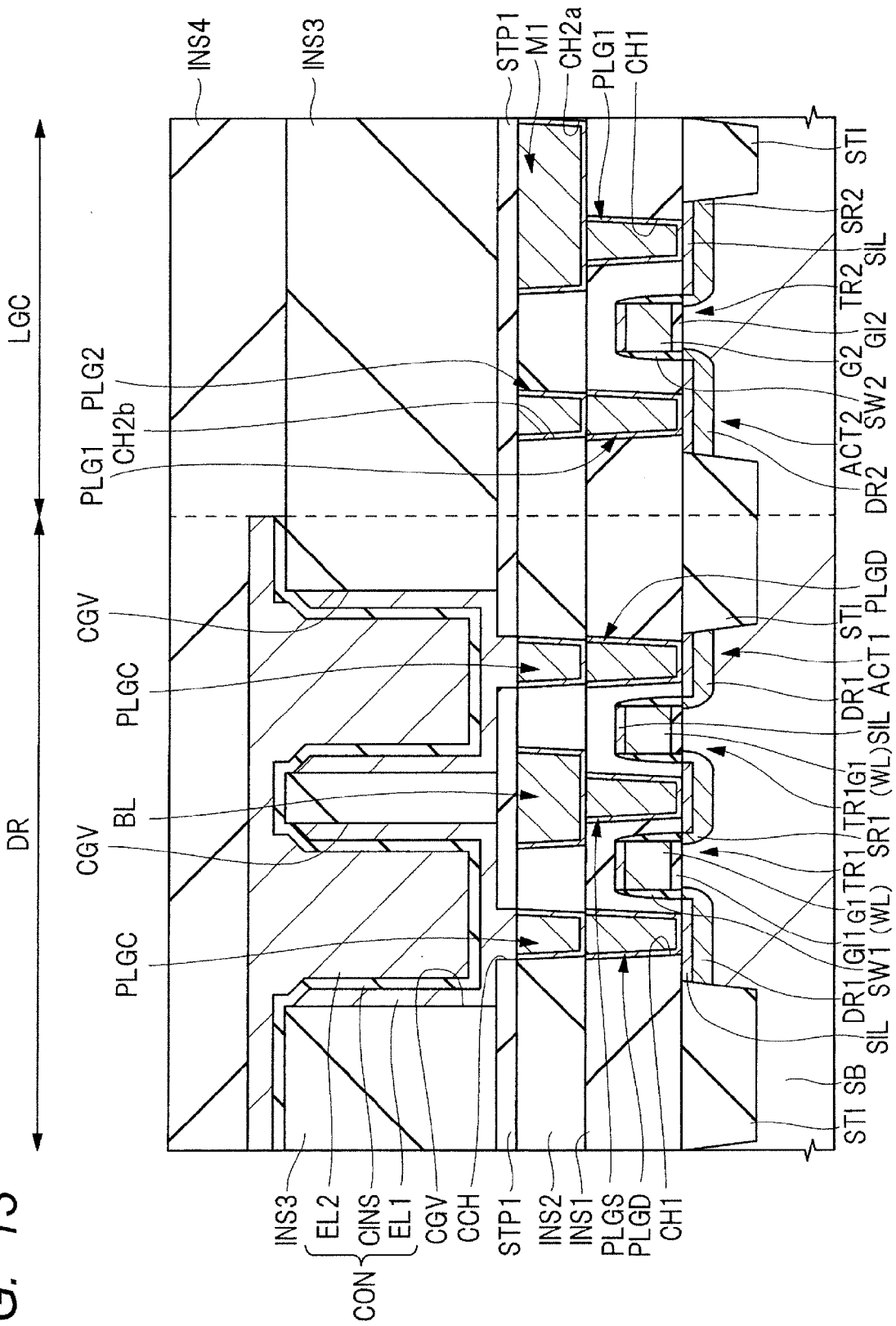
FIG. 13 is a sectional view of an essential part in the semiconductor integrated circuit device during a manufacturing step following that in FIG. 12.

FIG. 13 is a view for explaining a step of forming the dielectric film CINS, the second electrode EL2, and the interlayer insulating film INS4. The dielectric film CINS and the second electrode EL2 are formed (deposited) along the upper surface of the first electrode EL1 by a PCVD method. The dielectric film CINS and the second electrode EL2 are commonly provided for the first electrodes EL1. That is, the dielectric film CINS and the second electrode EL2 continuously extend also from the inside of the adjacent capacitance formation trench CGV to the upper surface of the interlayer insulating film INS3 with the adjacent capacitance formation trench CGV. The dielectric film CINS and the second electrode EL2 are formed in the DRAM region DR, while they are removed in the logic circuit region LGC. Subsequently, the interlayer insulating film INS4 including an insulating film is formed by a CVD method, so that the second electrode EL2 in the DRAM region DR and the interlayer insulating film INS3 in the logic circuit region LGC are covered.

Figure 14:
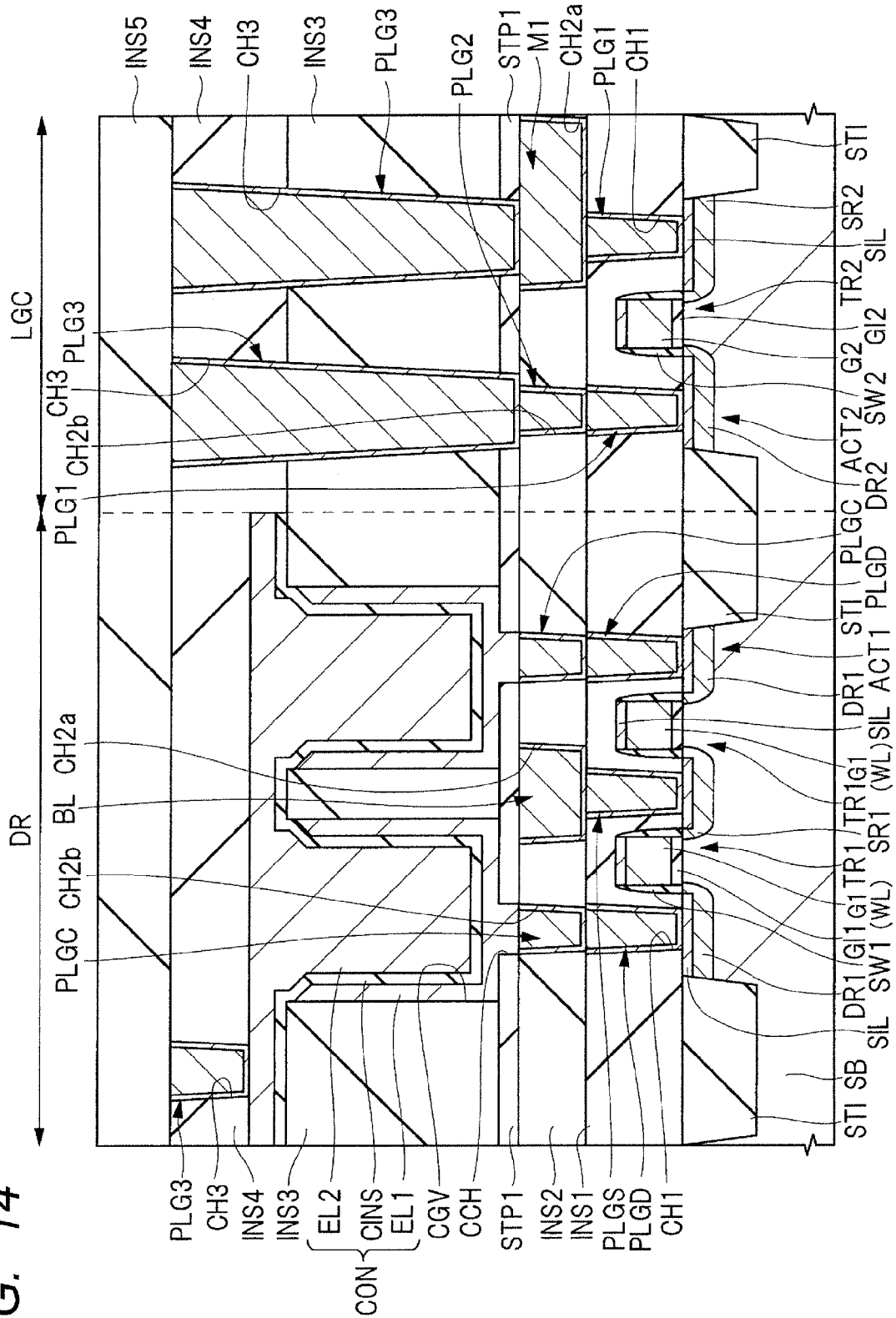
FIG. 14 is a sectional view of an essential part in the semiconductor integrated circuit device during a manufacturing step following that in FIG. 13.

FIG. 14 is a view for explaining a step of forming the plug electrode PLG3 and the interlayer insulating film INS5. In the DRAM region DR, the plug electrode PLG3 is provided so as to penetrate the interlayer insulating film INS4, so that the plug electrode PLG3 contacts the second electrode EL2 to be electrically coupled thereto. In the logic circuit region LGC, the plug electrode PLG3 is provided so as to penetrate the interlayer insulating film INS4, the interlayer insulating film INS3, and the stopper film STP1, so that the plug electrode PLG3 contacts the plug electrode PLG2 and the wiring M1 to be electrically coupled to them. With respect to the contact hole CH3 in which the plug electrode PLG3 is formed, the depth of the contact hole CH3 in the DRAM region DR is different from that of the contact hole CH3 in the logic circuit region LGC, but the contact holes CH3 are simultaneously formed by using, for example, a dry etching method. In forming the contact hole CH3, the second electrode EL2 functions as an etching stopper for the interlayer insulating film INS4 and the interlayer insulating film INS3 in the DRAM region DR, while the stopper film STP1 functions as an etching stopper for them in the logic circuit region LGC. Subsequently, the interlayer insulating film INS5 including an insulating film is formed, for example, by a CVD method so as to cover the plug electrode PLG3. Thereafter, the wiring trench CH4a is formed in the interlayer insulating film INS5 such that the wiring M2 including copper wiring is formed in the wiring trench CH4a, thereby allowing the structure illustrated in FIG. 3 to be completed. In the DRAM region DR, the wiring M2 is electrically coupled to the second electrode EL2 of the capacitive element CON via the plug electrode PLG3, so that a predetermined potential is supplied to the second electrode EL2. In the logic circuit region LGC, the wiring M2 is electrically coupled to the source region SR2 or the drain region DR2 of the logic MISFET (TR2), so that a predetermined potential or signal is supplied to the source region SR2 or the drain region DR2 thereof.

According to the present embodiment, it is designed that: the coupling between the drain DR1 of the selection MISFET (TR1) and the first electrode EL1 of the capacitive element CON is achieved by a plug electrode having a two-step laminated structure (i.e., a laminated structure of the drain plug electrode PLGD and the capacitive plug electrode PLGC); and the height of the capacitive plug electrode PLGC is made equal to that of the bit line BL. Accordingly, in comparison with Patent Document 1, the height of the capacitive plug electrode PLGC (second plug electrode in Patent Document 1) can be made smaller and (when it is assumed that the area of the upper surface of the capacitive plug electrode PLGC and that of the second plug electrode in Patent Document 1 are equal to each other) the area of the bottom surface of the capacitive plug electrode PLGC can be made larger, and hence the resistance of the capacitive plug electrode PLGC can be reduced. Accordingly, the resistance between the drain region DR1 of the selection MISFET (TR1) and the first electrode EL1 of the capacitive element CON can be reduced, and the operating speed of the eDRAM can be improved.

Further, because the coupling between the drain region DR1 of the selection MISFET (TR1) and the first electrode EL1 of the capacitive element CON is designed to be achieved by a plug electrode having a two-step laminated structure (i.e., a laminated structure of the drain plug electrode PLGD and the capacitive plug electrode PLGC), the height of each of the drain plug electrode PLGD and the capacitive plug electrode PLGC can be made smaller in comparison with Patent Document 2. Furthermore, (when it is assumed that the area of the upper surface of the capacitive plug electrode PLGC and that of a first contact hole in Patent Document 2 are equal to each other) the area of the bottom surface of each of the drain plug electrode PLGD and the capacitive plug electrode PLGC can be made larger. Accordingly, the resistance between the drain region DR1 of the selection MISFET (TR1) and the first electrode EL1 of the capacitive element CON can be reduced, and the operating speed of the eDRAM can be improved.

Because the coupling between the drain region DR1 of the selection MISFET (TR1) and the first electrode EL1 of the capacitive element CON is designed to be achieved by a plug electrode having a two-step laminated structure (i.e., a laminated structure of the drain plug electrode PLGD and the capacitive plug electrode PLGC), the height of each of the drain plug electrode PLGD and the capacitive plug electrode PLGC can be made small. That is, the aspect ratio of the contact hole CH1 formed in the interlayer insulating film INS1 and that of the contact hole CH2b formed in the interlayer insulating film INS2 become small, and hence a manufacturing yield can be improved.

High integration of the DRAM memory array can be achieved by processing both the wiring trench CH2a for the bit line BL and the contact hole CH2b, which are formed in the interlayer insulating film INS2, in steps different from each other.

Second Embodiment

The present Second Embodiment corresponds to a variation of the aforementioned First Embodiment.

In the present Second Embodiment, a method of forming a sidewall insulating film SWN over the sidewall of the wiring trench CH2a that has been formed in First Embodiment, and a structure of the sidewall insulating film SWN will be described.

Figure 15:
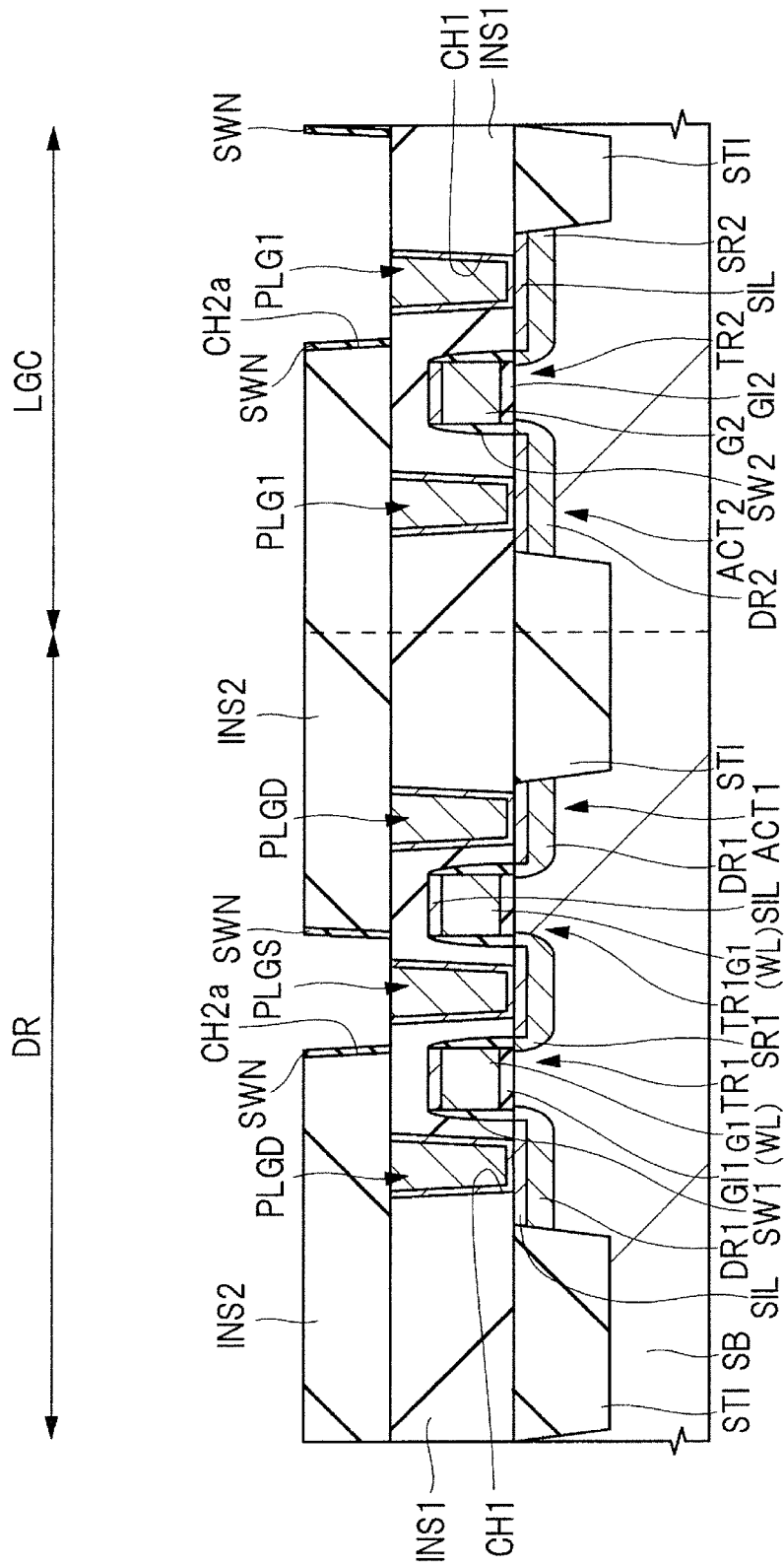
FIG. 15 is a sectional view of an essential part for illustrating a method of manufacturing a semiconductor integrated circuit device of Second Embodiment.

FIG. 15 is a sectional view of an essential part during a manufacturing step for a semiconductor integrated circuit device of the present Second Embodiment. In Second Embodiment, the steps described with reference to FIGS. 4 to 7 are also performed, similarly to First Embodiment. Subsequently, after the resist film PR2 in FIG. 7 is removed, an insulating film including, for example, a silicon nitride film or silicon oxide film is formed (deposited) over the interlayer insulating film INS2 and in the wiring trench CH2a, and the sidewall insulating film SWN is selectively formed over the sidewall of the wiring trench CH2a by performing anisotropic dry etching on this insulating film. The sidewall insulating film SWN is formed to have a width of, for example, 10 nm. Thereafter, the steps described with reference to FIG. 8 or later in First Embodiment will be similarly performed.

Figure 16:
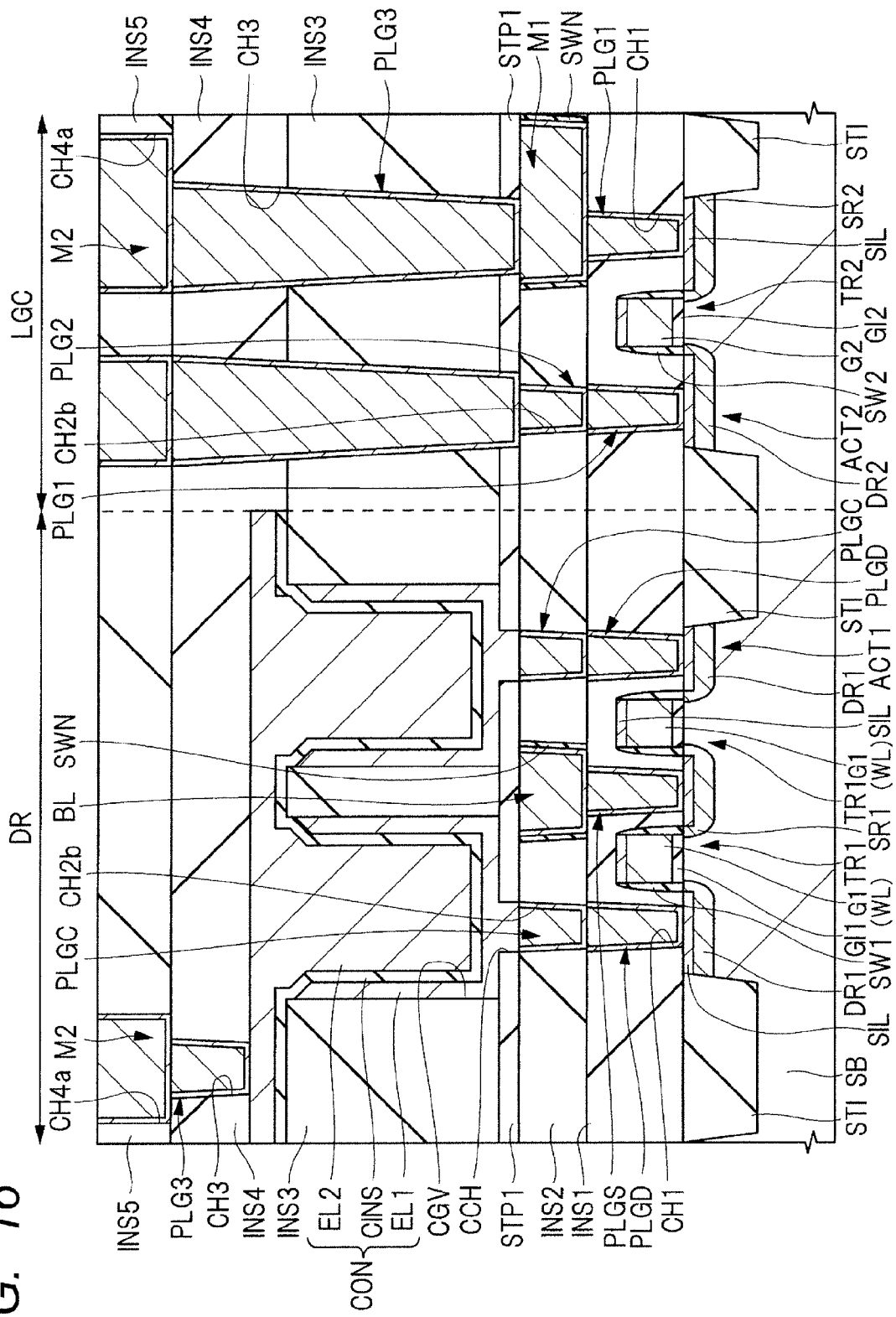
FIG. 16 is a sectional view of essential parts in a DRAM region and a logic circuit region in the semiconductor integrated circuit device of Second Embodiment.

FIG. 16 is a sectional view of an essential part in the DRAM region DR and the logic circuit region LGC of the present Second Embodiment, which corresponds to FIG. 3 in First Embodiment. As illustrated in FIG. 16, the sidewall insulating film SWN is formed over the sidewall of each of the bit line BL and the wiring M1. That is, in comparison with First Embodiment, the outer circumference (in the width direction and in the length direction) of each of the bit line BL and the wiring M1 is smaller (or is shorter) by two times the thickness of the sidewall insulating film SWN, in plan view. In Second embodiment, it is better to form the wiring trench CH2a, the sidewall insulating film SWN, and the contact hole CH2b in this order. If the wiring trench CH2a and the contact hole CH2b are formed in an inverted order, the sidewall insulating film SWN is formed also around the capacitive plug electrode PLGC and the resistance of the capacitive plug electrode PLGC is increased, which is not preferred.

The present Second Embodiment provides the following advantages in addition to ones described in the aforementioned First Embodiment.

Because the bit line BL can be made fine, the distance between the bit line BL and the capacitive plug electrode PLGC can be made small, and hence further high integration of the DRAM memory array can be achieved.

After the wiring trench CH2a is formed, the sidewall insulating film SWN is formed, and thereafter the contact hole CH2b is formed. Then, the bit line BL is formed in the wiring trench CH2a and the capacitive plug electrode PLGC is formed in the contact hole CH2b, and hence a margin by which a short circuit between the capacitive plug electrode PLGC and the bit line BL may be prevented can be increased, thereby allowing a manufacturing yield to be further improved.

Third Embodiment

The present Third Embodiment corresponds to a variation of the aforementioned First Embodiment.

In the present Third Embodiment, each of the capacitive plug electrode PLGC, the bit line BL, the plug electrode PLG2, and wiring M1 is formed by a copper (Cu) film.

Figure 17:
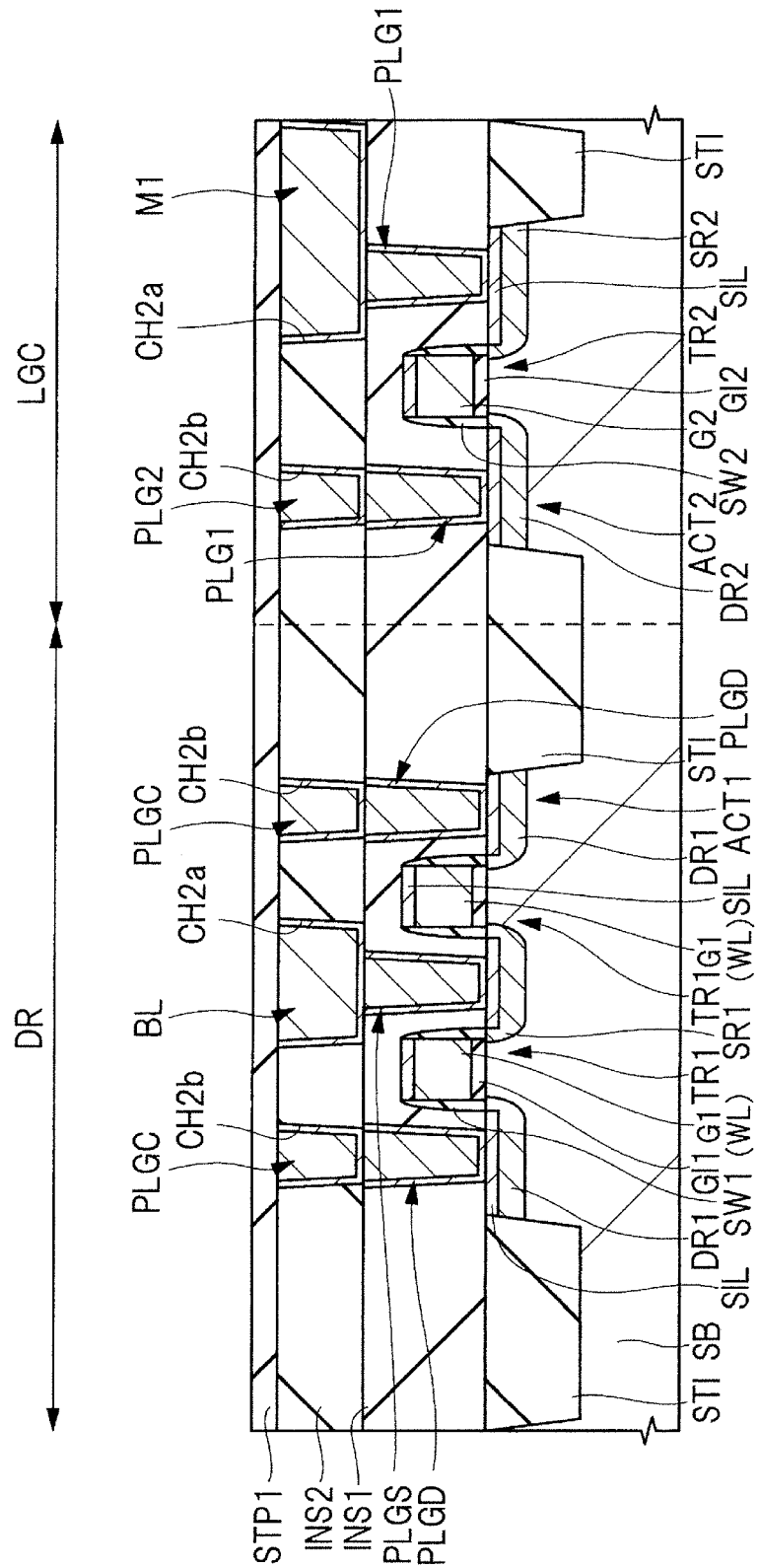
FIG. 17 is a sectional view of an essential part for illustrating a method of manufacturing a semiconductor integrated circuit device of Third Embodiment.

FIGS. 17 to 20 are sectional views of an essential part during manufacturing steps for a semiconductor integrated circuit device of the present Third Embodiment. FIG. 17 is a view for explaining a step of forming the capacitive plug electrode PLGC, the plug electrode PLG2, the bit line BL, the wiring M1, and the stopper film STP1, which corresponds to FIG. 9 in First Embodiment. After the steps described with reference to FIGS. 4 to 8 are performed, the resist film PR3 is removed, similarly to First Embodiment. Subsequently, the barrier conductor film and the main conductor film are sequentially formed (deposited) over the interlayer insulating film INS1. The description with respect to FIG. 9 is also true in Third Embodiment. In Third Embodiment, however, a copper film is used for each of the capacitive plug electrode PLGC, the plug electrode PLG2, the bit line BL, and the wiring M1, and hence the barrier conductor film includes, for example, a tantalum (Ta) film, titanium nitride (TiN) film, tantalum nitride (TaN) films, or laminated film thereof, and the main conductor film, having a thickness larger than that of the barrier conductor film, includes, for example, a copper (Cu) film. By performing the step described with reference to FIG. 9, the capacitive plug electrode PLGC, the plug electrode PLG2, the bit line BL, and the wiring M1, each of which is formed by a laminated film (structure) of the barrier conductor film and the main conductor film, can be formed. Herein, as the stopper film STP1, a silicon nitride (SiN) film, a silicon carbonitride (SiCN) film, or the like is used.

Subsequently, a step of forming the capacitive contact hole CCH described with reference to FIG. 10 will be performed.

Figure 18:
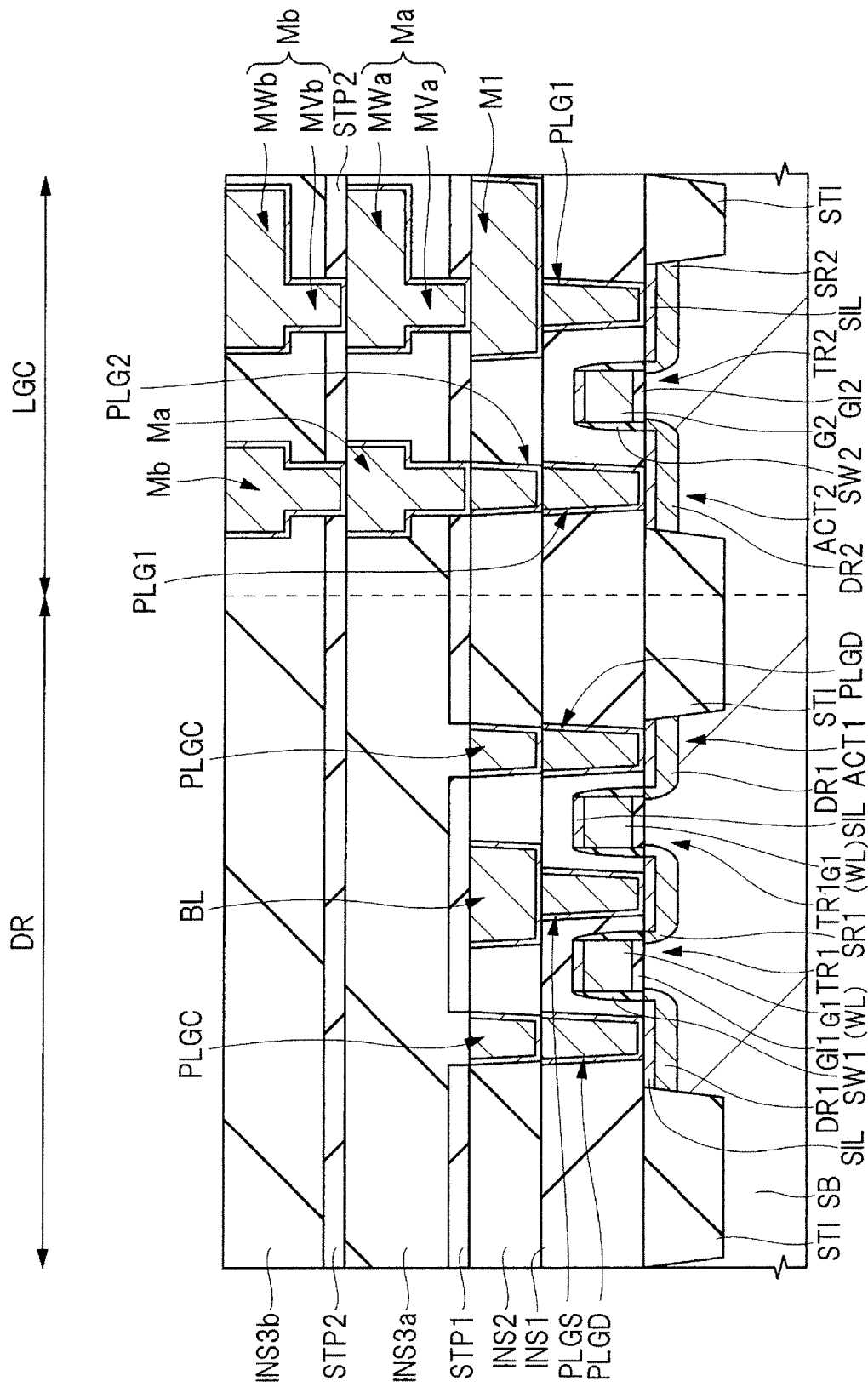
FIG. 18 is a sectional view of an essential part in the semiconductor integrated circuit device during a manufacturing step following that in FIG. 17.

FIG. 18 is a view for explaining a step of forming an interlayer insulating film INS3a, wiring Ma, a stopper film STP2, an interlayer insulating film INS3b, and wiring Mb. The interlayer insulating film INS3a is first formed (deposited) over the stopper film STP1. The interlayer insulating film INS3a is formed by a low-k film such as a SiCOH film. In the logic circuit region LGC, the wiring Ma is formed in the interlayer insulating film INS3a. The wiring Ma includes a copper (Cu) film, and is formed by a wiring portion MWa and a via portion MVa. The wiring portion MWa and the via portion MVa are integrated with each other to form a laminated structure of a barrier film and a main conductor film, in which the barrier conductor film includes, for example, a tantalum (Ta) film, titanium nitride (TiN) film, tantalum nitride (TaN) film, or laminated film thereof, and the main conductor film, having a thickness larger than that of the barrier conductor film, includes, for example, a copper (Cu) film. The via portion MVa of the wiring Ma is electrically coupled to the plug electrode PLG2 or the wiring M1 via an opening formed in the stopper film STP1.

Subsequently, the stopper film STP2 is formed (deposited) so as to cover the wiring Ma and the interlayer insulating film INS3a. As the stopper film STP2, a silicon nitride (SiN) film, a silicon carbonitride (SiCN) film, or the like is used. The interlayer insulating film INS3b is formed (deposited) over the stopper film STP2. The interlayer insulating film INS3b is formed by a low-k film such as a SiCOH film. In the logic circuit region LGC, the wiring Mb is formed in the interlayer insulating film INS3b. The wiring Mb includes a copper (Cu) film, and is formed by a wiring portion MWb and a via portion MVb. The wiring Mb is formed of a material similar to that of the wiring Ma, and is electrically coupled to the wiring Ma via an opening formed in the stopper film STP2.

Figure 19:
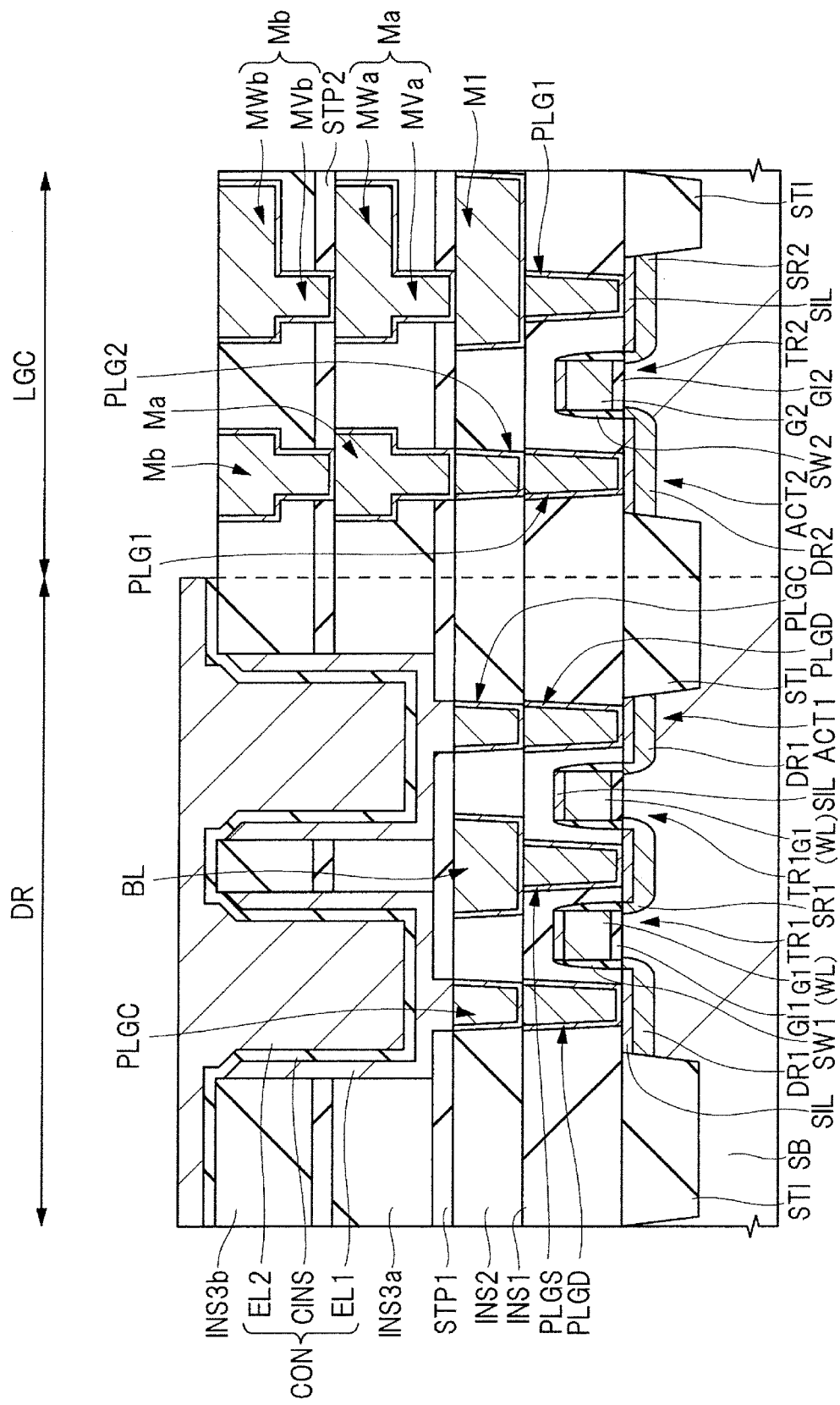
FIG. 19 is a sectional view of an essential part in the semiconductor integrated circuit device during a manufacturing step following that in FIG. 18.

FIG. 19 is a view for explaining a step of forming the capacitive element. A plurality of the capacitive elements CON are formed in the DRAM region DR by performing the steps described with reference to FIGS. 11 to 13 after the step described with reference to FIG. 18. In Third Embodiment, a film corresponding to the interlayer insulating film INS3 in First Embodiment is a laminated structure of the interlayer insulating film INS3a, the stopper film STP2, and the interlayer insulating film INS3b.

Figure 20:
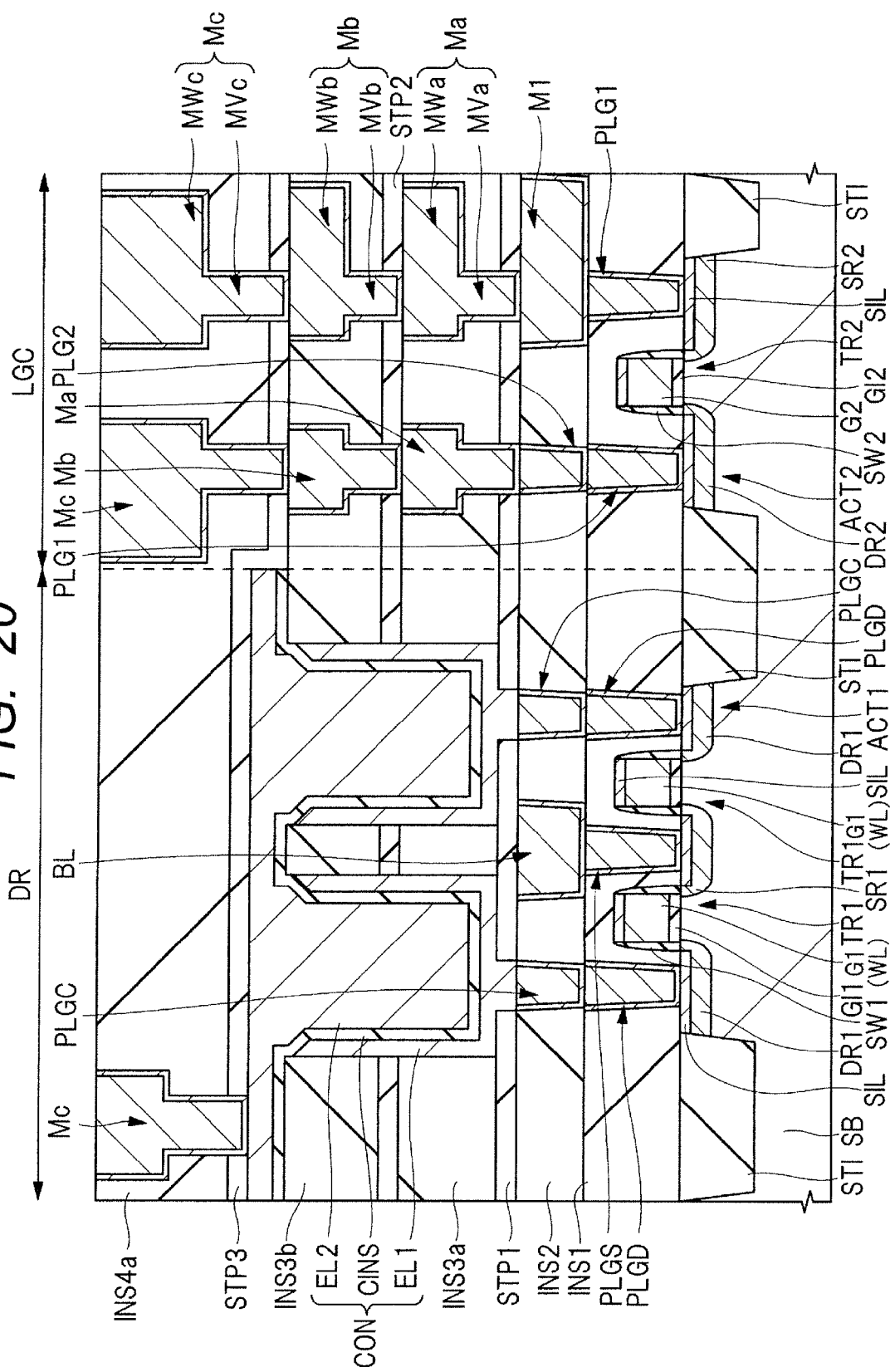
FIG. 20 is a sectional view of an essential part in the semiconductor integrated circuit device during a manufacturing step following that in FIG. 19.

FIG. 20 is a view for explaining a step of forming a stopper film STP3, an interlayer insulating film INS4a, and wiring Mc. The stopper film STP3 is formed over both the second electrode EL2 that forms the capacitive element CON and the wiring Mb in the logic circuit region LGC. As the stopper film STP3, a silicon nitride (SiN) film, a silicon carbonitride (SiCN) film, or the like is used. The interlayer insulating film INS4a is formed (deposited) over the stopper film STP3. The interlayer insulating film INS4a is formed by a low-k film such as a SiCOH film. The wiring Mc is formed in the interlayer insulating film INS4a. The wiring Mc includes a copper (Cu) film, and is formed by a wiring portion MWc and a via portion MVc. The wiring Mc is formed of a material similar to that of the wiring Ma, and is electrically coupled, in the logic circuit region LGC, to the wiring Mb via an opening formed in the stopper film STP3. Additionally, the wiring Mc is electrically coupled, in the DRAM region DR, to the second electrode EL2 of the capacitive element CON via an opening formed in the stopper film STP3. In Third Embodiment, a two-layered wiring layer is formed in the logic circuit region LGC of the interlayer insulating film INS3a and the interlayer insulating film INS3b in which the capacitive element CON is formed; however, a wiring layer having, for example, one layer or three or more layers may be formed.

In Third Embodiment, the sidewall insulating film. SWN of Second Embodiment may be applied.

The present Third Embodiment provides the following advantages in addition to ones described in the aforementioned First Embodiment.

The resistance between the drain region DR1 of the selection MISFET (TR1) and the first electrode EL1 of the capacitive element CON can be reduced by using a copper film for the capacitive plug electrode PLGC, and hence the operating speed of the eDRAM can be improved.

The resistance of the bit line BL can be reduced by using a copper film as the bit line BL, and hence the operating speed of the eDRAM can be improved.

The wiring margin of the logic circuit region LGC can be improved by providing the wiring Ma and Mb each including a copper film with the use of the interlayer insulating films INS3a and INS3b in which the capacitive element CON is formed.

The invention made by the present inventors has been specifically described above based on its preferred embodiments; however, the invention should not be limited to the embodiments, and it is needless to say that the invention may be modified variously within a range not departing from the gist thereof.

What is claimed is:

1. A semiconductor integrated circuit device comprising:
    a semiconductor substrate;
    a word line extending in a first direction in a main surface of the semiconductor substrate;
    a bit line extending in a second direction that intersects with the first direction in the main surface of the semiconductor substrate;
    a gate electrode that is formed in the main surface of the semiconductor substrate and serves as the word line;
    a MISFET having a source region and a drain region that are formed in the main surface of the semiconductor substrate so as to sandwich the gate electrode;
    a first interlayer insulating film that is formed over the main surface of the semiconductor substrate so as to cover the MISFET;
    a source plug electrode that penetrates the first interlayer insulating film to be electrically coupled to the source region;
    a drain plug electrode that penetrates the first interlayer insulating film to be electrically coupled to the drain region;
    a second interlayer insulating film formed over the first interlayer insulating film;
    a capacitive plug electrode that penetrates the second interlayer insulating film to be electrically coupled to the drain plug electrode;
    the bit line that penetrates the second interlayer insulating film to be electrically coupled to the source plug electrode;
    a first insulating film covering the bit line; and
    a capacitive element that is formed over the first insulating film and has a first electrode, a dielectric film, and a second electrode,
    wherein the first electrode is electrically coupled to the capacitive plug electrode,
    and wherein a height of the capacitive plug electrode and that of the bit line are equal to each other.

2. The semiconductor integrated circuit device according to claim 1,
    wherein a height of the drain plug electrode and that of the source plug electrode are equal to each other.

3. The semiconductor integrated circuit device according to claim 1,
    wherein a thickness of the second interlayer insulating film is smaller than that of the first interlayer insulating film.

4. The semiconductor integrated circuit device according to claim 3,
    wherein the capacitive plug electrode has a circular first upper surface and a circular first bottom surface in plan view, and a diameter of the first upper surface is larger than that of the first bottom surface.

5. The semiconductor integrated circuit device according to claim 4,
    wherein the drain plug electrode has a circular second upper surface and a circular second bottom surface in plan view, and a diameter of the second upper surface is larger than that of the second bottom surface.

6. The semiconductor integrated circuit device according to claim 1,
    wherein the first insulating film has a first opening, and the first electrode is electrically coupled to the capacitive plug electrode via the first opening.

7. The semiconductor integrated circuit device according to claim 6 further comprising:
    over the first insulating film, a third interlayer insulating film having a plurality of second openings,
    wherein the first electrode is formed along both a sidewall of the third interlayer insulating film that forms the second openings and an upper surface of the first insulating film in the second openings,
    and wherein the dielectric film and the second electrode are formed over the first electrode.

8. The semiconductor integrated circuit device according to claim 7,
    wherein the first electrode overlaps the bit line in plan view.

9. The semiconductor integrated circuit device according to claim 1,
    wherein the word line has, in plan view, a first portion that has a first width and extends in the first direction and a second portion that has a second width and extends in the first direction, and the first width is larger than the second width.

10. The semiconductor integrated circuit device according to claim 9,
    wherein in the first direction in plan view, a distance between the bit line and the capacitive plug electrode, which are adjacent to each other, is smaller than the second width of the word line.

11. The semiconductor integrated circuit device according to claim 1,
    wherein each of the capacitive plug electrode and the bit line has a laminated film of a barrier conductor film and a main conductor film including a copper film.

12. A method of manufacturing a semiconductor integrated circuit device, comprising the steps of:
    (a) forming, in a main surface of a semiconductor substrate, a MISFET having a gate electrode, a source region, and a drain region;
    (b) forming a first interlayer insulating film over the main surface of the semiconductor substrate so as to cover the MISFET;
    (c) after a first contact hole for exposing the source region or the drain region is formed in the first interlayer insulating film, forming a source plug electrode coupled to the source region or a drain plug electrode coupled to the drain region in the first contact hole;
(d) forming a second interlayer insulating film over the first interlayer insulating film;
(e) forming both a second contact hole in the second interlayer insulating film so as to expose an upper surface of the drain plug electrode and a wiring trench in the second interlayer insulating film so as to expose an upper surface of the source plug electrode;
(f) forming both a capacitive plug electrode in the second contact hole and a bit line in the wiring trench;
(g) forming, over the bit line, an insulating film having a first opening for exposing an upper surface of the capacitive plug electrode;
(h) forming, over the insulating film, a third interlayer insulating film having a second opening for exposing the upper surface of the capacitive plug electrode; and
(i) forming a first electrode, a dielectric film, and a second electrode in this order in the second opening,
wherein the first electrode, the dielectric film, and the second electrode form a capacitive element, and the first electrode is electrically coupled to the capacitive plug electrode.

13. The method of manufacturing a semiconductor integrated circuit device according to claim 12,
wherein the step (f) includes the steps of:
(f-1) forming a barrier conductor film and a main conductor film in this order in the second contact hole and the wiring trench; and
(f-2) removing the main conductor film and the barrier conductor film over the second interlayer insulating film by performing CMP processing on them.

14. The method of manufacturing a semiconductor integrated circuit device according to claim 13,
wherein a height of the capacitive plug electrode and that of the bit line are equal to each other.

15. The method of manufacturing a semiconductor integrated circuit device according to claim 13,
wherein the main conductor film includes a copper film.

16. The method of manufacturing a semiconductor integrated circuit device according to claim 12,
wherein the step (c) includes the steps of:
(c-1) forming a barrier conductor film and a main conductor film in this order in the first contact hole, and
(c-2) removing the main conductor film and the barrier conductor film over the first interlayer insulating film by performing CMP processing on them.

17. The method of manufacturing a semiconductor integrated circuit device according to claim 12,
wherein the step (e) includes the steps of:
(e-1) forming the wiring trench by using a first mask, and
(e-2) after the step (e-1), forming the second contact hole by using a second mask different from the first mask.

18. The method of manufacturing a semiconductor integrated circuit device according to claim 17 further comprising:
(e-3) between the step (e-1) and the step (e-2), forming a sidewall insulating film over a sidewall of the second interlayer insulating film in the wiring trench.

19. The method of manufacturing a semiconductor integrated circuit device according to claim 18,
wherein the sidewall insulating film includes a silicon oxide film or a silicon nitride film.

* * * * *